United States Patent
Suzuki et al.

(10) Patent No.: US 6,270,619 B1
(45) Date of Patent: *Aug. 7, 2001

(54) TREATMENT DEVICE, LASER ANNEALING DEVICE, MANUFACTURING APPARATUS, AND MANUFACTURING APPARATUS FOR FLAT DISPLAY DEVICE

(75) Inventors: Naoki Suzuki; Noriyuki Hirata, both of Fukaya; Masatoshi Shimizu, Yokohama; Takuo Higashijima, Toda; Hiroaki Takahashi; Yoshiaki Komatsubara, both of Fukaya, all of (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/229,581

(22) Filed: Jan. 13, 1999

(30) Foreign Application Priority Data

Jan. 13, 1998 (JP) .................................................. 10-005176
Jun. 24, 1998 (JP) .................................................. 10-177516

(51) Int. Cl.⁷ .................................................. H01L 21/00
(52) U.S. Cl. .................... 156/345; 118/719; 204/298.25; 204/298.35
(58) Field of Search .......................... 156/345; 118/719; 204/298.35, 298.25; 219/428

(56) References Cited

U.S. PATENT DOCUMENTS 5,700,127 * 12/1997 Harada et al. ..................... 118/719
5,923,966 * 7/1999 Teramoto et al. .................. 438/162

FOREIGN PATENT DOCUMENTS

| 5-217918 | 8/1993 | (JP) . |
| 5-283348 | 10/1993 | (JP) . |
| 7-78759 | 3/1995 | (JP) . |
| 8-274143 | 10/1996 | (JP) . |
| 9-139356 | 5/1997 | (JP) . |
| 9-246198 | 9/1997 | (JP) . |
| 9-260275 | 10/1997 | (JP) . |
| 10-31316 | 2/1998 | (JP) . |

* cited by examiner

Primary Examiner—Thi Dang
(74) Attorney, Agent, or Firm—Pillsbury Winthrop LLP

(57) ABSTRACT

A film forming device in a substrate manufacturing apparatus a stage section on which a cassette storing a plurality of glass substrates is mounted. A treatment section for subjecting the substrate to a predetermined treatment is arranged to oppose the stage section. A washing section for washing the substrate is arranged near the stage section and the treatment section and deviated from a space between the stage section and the treatment section in a second direction crossing a first direction passing through the stage section and the treatment section. A transfer robot is arranged between the stage section and the treatment section. The transfer robot transfers the substrate between the stage section, treatment section, and washing section and loads the substrate, washed in the washing section, directly into the treatment section.

17 Claims, 14 Drawing Sheets

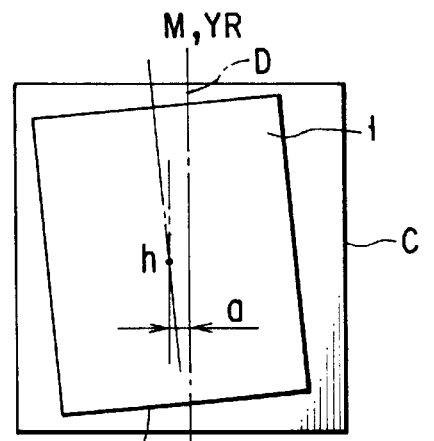
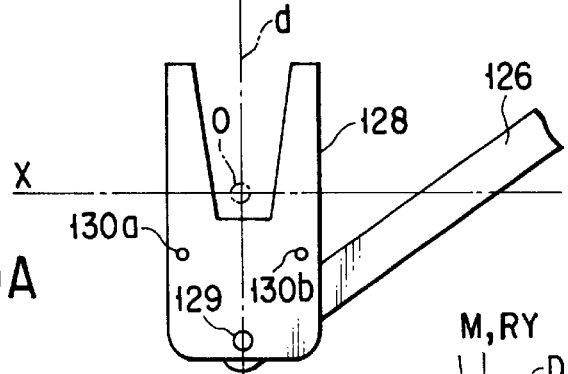
FIG. 10A
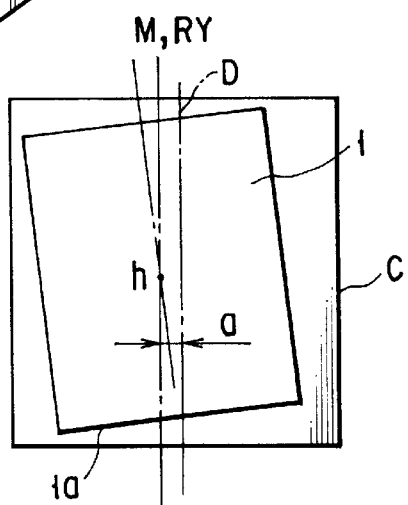
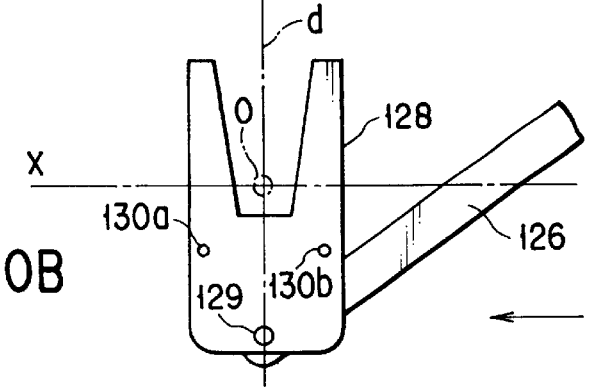
FIG. 10B

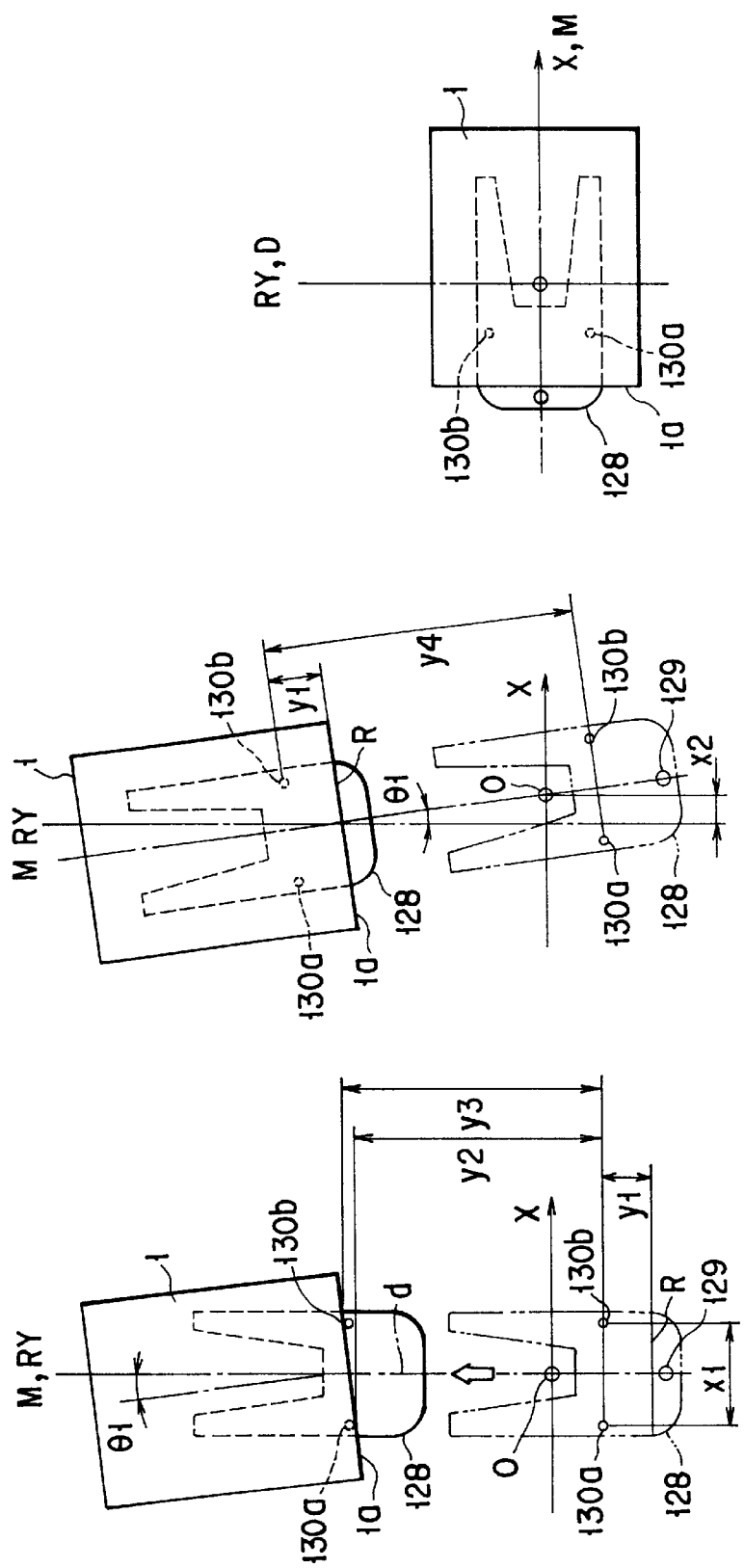

TREATMENT DEVICE, LASER ANNEALING DEVICE, MANUFACTURING APPARATUS, AND MANUFACTURING APPARATUS FOR FLAT DISPLAY DEVICE

BACKGROUND OF THE INVENTION

The present invention relates to a treatment device for subjecting an object to a desired treatment after washing the object, a laser annealing device for annealing an object by laser irradiation, a manufacturing apparatus provided with the treatment device or the laser annealing device, and a manufacturing apparatus for a flat display device.

In manufacturing processes for manufacturing an array substrate of an liquid crystal display panel for use as a flat display device, such as a film forming process, etching process, laser annealing process, etc., substrates are washed before pretreatments in order to secure the cleanness of the substrates, in general. To attain this, a manufacturing apparatus comprises a plurality of treatment devices for carrying out the individual processes and a washing device provided independently of the treatment devices. The substrates, to-be-treated objects, are transported between the washing device and the treatment devices by means of a truck or an AGV (automatic transportation vehicle) in a manner such that they are set in a cassette.

In the case where the treatment devices and the washing device are arranged separately, however, the entire manufacturing apparatus requires a wide installation space, and the substrates are transferred between the devices. Therefore, the transportation takes so much time that the substrates may possibly be soiled and the lead time is long.

Further, the treatment time or Q-time requires management, and introduction of the substrates into each preceding stage is restricted by conditions for each succeeding stage, so that the processing operation of the manufacturing apparatus is complicated as a whole.

In a known laser annealing device for the laser annealing process, a laser is applied to non-single crystalline (amorphous) silicon film formed on a substrate to anneal the silicon layer, thereby forming a polycrystalline silicon film. If the annealing process is carried out in an ambient atmosphere with a high oxygen concentration, for example, in the laser annealing device, the resulting polycrystalline silicon film may possibly be poor in properties.

To avoid this, a novel annealing device is developed and described in Jpn. Pat. Appln. KOKAI Publication No. 9-275080, for example. This device is designed so that a substrate inlet chamber, transfer chamber, annealing chamber, transfer chamber, and substrate outlet chamber are connected in succession by means of gate valves. In this device, a vacuum atmosphere or nitrogen atmosphere is defined in an annealing chamber by means of a vacuum exhaust system. In the annealing chamber, substrates are preheated and irradiated with a laser for annealing.

In the laser annealing device constructed in this manner, however, the vacuum exhaust system is needed to control the atmosphere in the annealing chamber, so that stabilizing the atmosphere takes a lot of time, and each chamber must be composed of the so-called vacuum chamber that is highly airtight, thus entailing an increase in manufacturing costs. Since a large number of chambers are connected in the device, moreover, the device is large-sized, and use of increased transportation mechanism parts for connecting the chambers and transporting substrates results in an increase in number of spots where particles are produced. If laser irradiation is carried out with impurities, such as boron, phosphorus, etc., adhering as particles to the substrates, the characteristics of formed transistors are adversely affected. In applying a laser to the substrates in the vacuum atmosphere or nitrogen atmosphere, moreover, the crystal grain size of non-single crystalline silicon is reduced and the mobility of the transistor characteristics is lowered unless the oxygen concentration of the atmosphere is adjusted to a given value. Furthermore, large quantities of gases are needed to define a predetermined atmosphere, such as a nitrogen atmosphere, in a large-sized chamber for preheating, as well as for annealing, thus entailing an increase in manufacturing costs.

BRIEF SUMMARY OF THE INVENTION

The present invention has been contrived in consideration of these circumferences, and its object is to provide a treatment device capable of preventing contamination of a to-be-treated object and shortening the treatment time, a laser annealing device designed to improve the quality of laser annealing and reduce the manufacturing costs, a laser annealing method, a manufacturing apparatus provided with the treatment device or the laser annealing device, and a manufacturing apparatus for a substrate of a flat display device.

In order to achieve the above object, a treatment device according to the present invention comprises; a stage section carrying a to-be-treated object thereon; a treatment section opposed to the stage section, for subjecting the object to a predetermined treatment; a washing section for washing the object, the washing section being located near to the stage section and the treatment section and deviated from a space between the stage section and the treatment section in a second direction crossing a first direction passing through the stage section and the treatment section; and a transportation mechanism arranged between the stage section and the treatment section for transferring the object between the stage section, treatment section, and washing section and loading the object, washed in the washing section, directly into the treatment section.

According to the treatment device constructed in this manner, the washing section and the treatment section are located adjacent to the stage section, so that the movement of the to-be-treated object can be reduced. In particular, the object washed in the washing section can be loaded directly into the treatment section, so that contamination of the object can be prevented, and the treatment time can be shortened. Since the washing section is situated across the direction of transportation of the object to the treatment section, moreover, the treatment device can be prevented from being unduly elongated in the direction in which the object is loaded into and unloaded from the treatment section.

According to the invention, moreover, the treatment section includes a transportation portion located adjacent to the stage section and one or more individual treatment portions located adjacent to the transportation portion. Thus, the time for the movement of the to-be-treated object can be shorted, and one or more treatments can be carried out for the one washing section.

For example, a treatment device for an excimer laser or a film forming chamber for chemical vapor deposition for forming a non-single-crystalline silicon film is provided as the individual treatment portion.

A laser annealing device according to the invention comprises: an annealing chamber storing a to-be-treated object in a manner such that an atmosphere surrounding a laser irradiation region of the object is kept at a pressure not lower than the atmospheric pressure; laser irradiation means for applying a laser beam to the laser irradiation region of the object stored in the annealing chamber, thereby subjecting the object to laser annealing; and transportation means for loading the object directly into the annealing chamber.

The laser annealing device further comprises a stage section opposed to the annealing chamber and carrying the to-be-treated object thereon and a washing section located adjacent to the stage section and the annealing chamber, for washing the object, and wherein the transportation means includes a transfer robot for transferring the object from the stage section to the washing section and loading the washed object from the washing section directly into the annealing chamber.

Moreover, a method of laser annealing a to-be treated object according to the invention comprises the steps of: loading the object into an annealing chamber; and annealing the object in the annealing chamber by applying a laser to a laser irradiation region of the object in a manner such that an atmosphere around the laser irradiation region is kept at a pressure not lower than the atmospheric normal pressure.

According to the laser annealing device and the laser annealing method described above, the object can be loaded directly into the annealing chamber, so that transportation mechanism parts between component units can be reduced in number. Thus, sources of particles can be reduced to ensure annealing in a stable atmosphere. In consequence, the quality of the treatment of the object can be improved. Further, laser annealing is carried out in an atmosphere at a pressure not lower than the atmospheric pressure, so that there is no need of a vacuum pump or the like. Thus, the construction is simplified, and therefore, the manufacturing costs can be reduced.

Since the washing section is located adjacent to the annealing chamber, moreover, the to-be-treated object can be transported to the annealing chamber without delay after pretreatments for annealing in the washing section. Accordingly, annealing can be effected in a manner such that particles are removed, and that non-single-crystalline silicon is prevented from natural oxidation or impurities, such as boron, phosphorus, etc., are removed and prevented from adhering to the object. Thus, the quality of the object is improved.

According to the invention, furthermore, an atmosphere separating cover that surrounds the laser irradiation region of the to-be-treated object is arranged in the annealing chamber, and gases are supplied to the inside of the cover by means of gas supply means. By doing this, the necessary atmosphere portion for annealing in the annealing chamber can be controlled with ease. Thus, the construction of the laser annealing device can be simplified to reduce the gas consumption and therefore, lower the manufacturing costs.

Moreover, the gas supply means includes detecting means for detecting the atmosphere inside the atmosphere separating cover and gas control means for controlling the gas to be supplied to the space inside the atmosphere separating cover. Therefore, annealing can be effected in a desired atmosphere, so that the quality of the to-be-treated object is improved.

A substrate having a thin film thereon is used as the to-be-treated object, and an excimer laser capable of changing the film quality is used as the laser. Accordingly, a non-single-crystalline silicon film can be suitably formed on a glass substrate, for example.

A to-be-treated object of a desired quality can be obtained by loading the annealing chamber with a nitrogen atmosphere. In this case, the oxygen concentration of the atmosphere in the chamber is adjusted to 0.1% to 13%, preferably 1.0% to 7.0%. A manufacturing apparatus according to the invention comprises: a transportation device for transporting a to-be-treated object along a predetermined transportation path; and a plurality of treatment devices arranged along the transportation path, for individually subjecting the object transported by the transportation device to predetermined treatments. At least one of the treatment devices includes a stage section carrying thereon the object transported by the transportation device, a treatment section opposed to the stage section for subjecting the object to a predetermined treatment, a washing section for washing the object, the washing section being located near to the stage section and the treatment section and deviated from a space between the stage section and the treatment section in a second direction crossing a first direction passing through the stage section and the treatment section, and a transportation mechanism arranged between the stage section and the treatment section for transferring the object between the stage section, treatment section, and washing section and loading the object, washed in the washing section, directly into the treatment section.

In the manufacturing apparatus described above, the first direction is perpendicular to the transportation path, and the second direction is substantially parallel to the transportation path.

Furthermore, a substrate manufacturing apparatus according to the invention comprises: a transportation device for transporting a substrate along a predetermined transportation path; and a plurality of treatment devices arranged along the transportation path, for individually subjecting the substrate transported by the transportation device to predetermined treatments. At least one of the treatment devices includes a stage section carrying thereon the substrate transported by the transportation device, a treatment section opposed to the stage section for subjecting the substrate to a predetermined treatment, a washing section for washing the substrate, the washing section being located near to the stage section and the treatment section and deviated from a space between the stage section and the treatment section in a second direction crossing a first direction passing through the stage section and the treatment section, and a transportation mechanism between the stage section and the treatment section for transferring the substrate between the stage section, treatment section, and washing section and loading the substrate, washed in the washing section, directly into the treatment section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 to 16 show a substrate manufacturing apparatus according to an embodiment of the present invention, in which:

FIG. 1 is a plan view schematically showing an outline of the manufacturing apparatus;

FIG. 2 is a perspective view showing a film forming device of the manufacturing apparatus;

FIG. 3 is a plan view of the film forming device;

FIG. 4 is a perspective view showing a cassette stage section and a transfer robot of the film forming device;

FIG. 5 is a sectional view of a cassette storing glass substrates;

FIG. 6 is a sectional view showing a glass substrate in the cassette and position sensors;

FIG. 8 is an enlarged plan view of a hand portion of the transfer robot;

FIG. 9 is a block diagram showing a configuration of the transfer robot;

FIG. 10A is a plan view showing the positional relation between the glass substrate in the cassette and the hand in a reference position;

FIG. 10B is a plan view showing the positional relation between the glass substrate in the cassette and the hand in a position corrected for a shift or deviation of the substrate from the reference position;

FIGS. 12A to 12C are plan views individually showing processes of inclination detecting operation for the glass substrate and hand correcting operation;

FIG. 13 is a plan view showing a laser annealing device of the substrate manufacturing apparatus;

FIG. 14 is a perspective view schematically showing the inside of an annealing chamber of the laser annealing device;

FIG. 15 is a sectional view of the annealing chamber;

FIG. 16 is a perspective view showing a wet etching device of the substrate manufacturing apparatus;

DETAILED DESCRIPTION OF THE INVENTION

An embodiment of the present invention applied to a substrate manufacturing apparatus for manufacturing an array substrate of a liquid crystal display device will now be described in detail with reference to the accompanying drawings of FIGS. 1 to 16.

Figure 1:
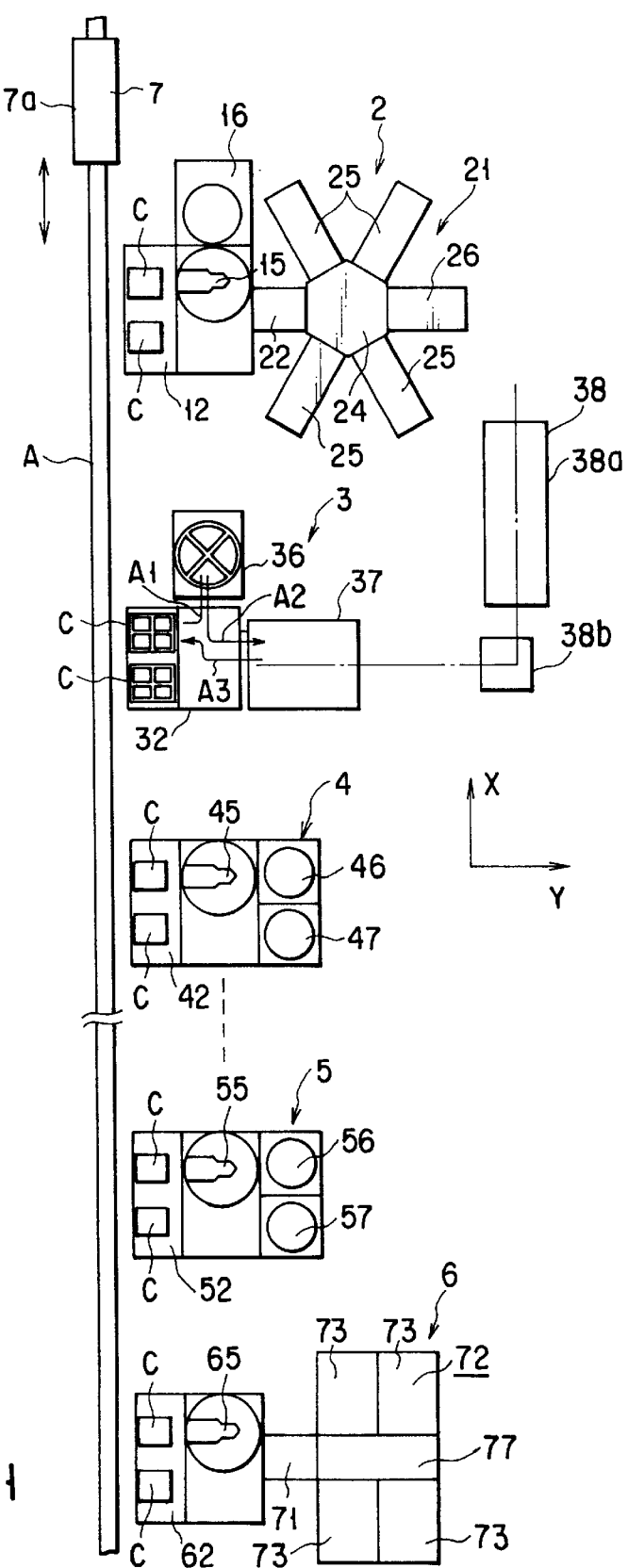

As shown in FIG. 1, the substrate manufacturing apparatus is an apparatus for manufacturing an array substrate of a liquid crystal display panel that is used in a color liquid crystal display device of an active-matrix type, for example. This apparatus subjects a glass substrate (to-be-treated object) for forming the array substrate to various treatments. More specifically, the substrate manufacturing apparatus comprises a transportation device (AGV) 7 for transporting the glass substrate along a predetermined transportation path, e.g., rectilinear transportation path A, and a plurality of treatment devices arranged along the path A. The treatment devices include a film forming device 2 for forming a thin film of a desired material on the glass substrate, laser annealing device 3 for subjecting a film formed on the glass substrate to laser annealing, dry etching device 4, ion doping device 5, wet etching device 6, etc. The general operation of the substrate manufacturing apparatus is controlled by means of a control device that is provided with a CPU (not shown) and the like.

The following is a detailed description of the individual treatment devices.

Figure 2:
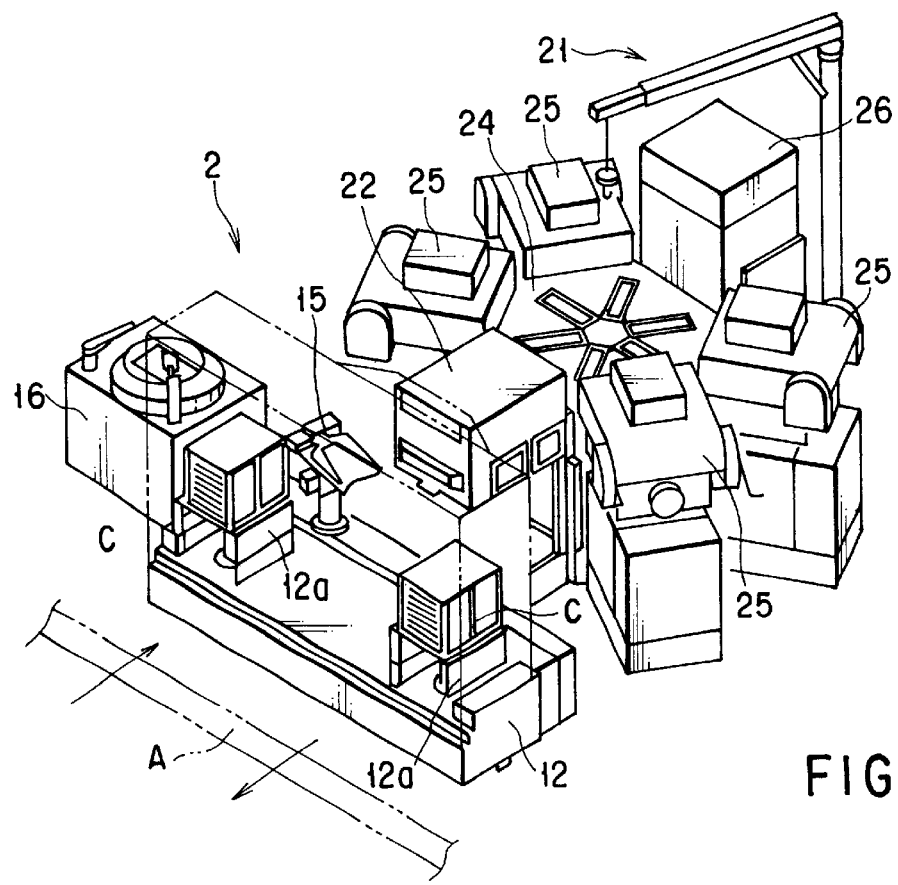
Figure 3:
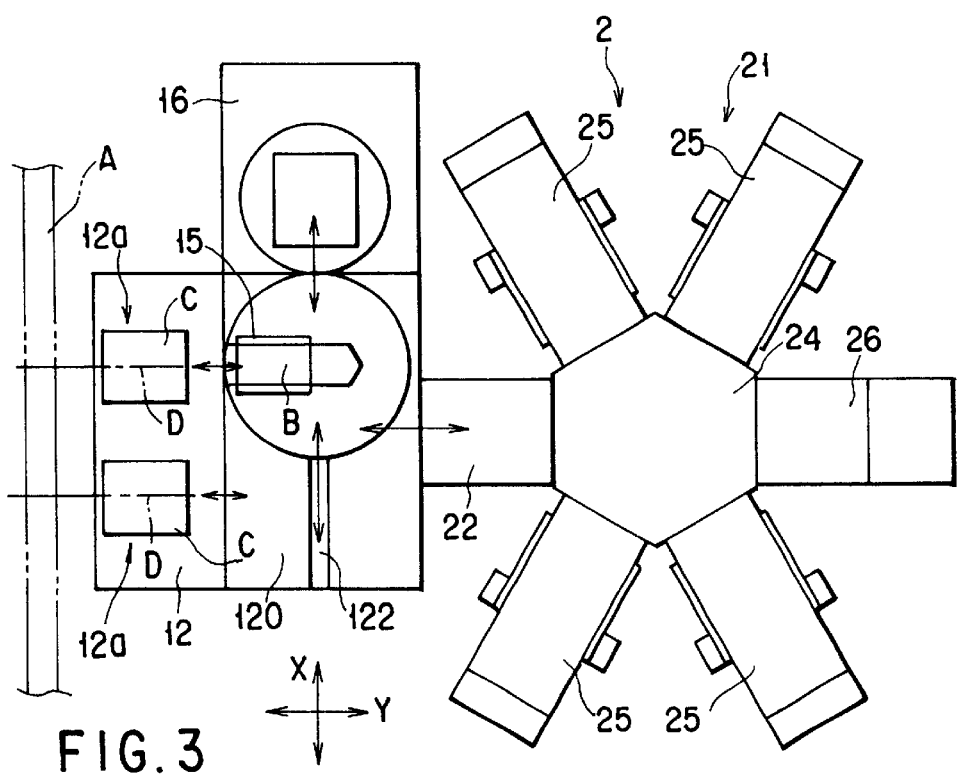

As shown in FIGS. 1 to 3, the film forming device 2 includes a cassette station 12 located near the transportation path A, treatment section 21 opposed to the station 12, and spin-washing unit 16 deviated sideways from the line of arrangement of the station 12 and the section 21. The device 2 further includes a transfer robot 15, which is located between the cassette station 12 and the treatment section 21. The robot 15 serves to transfer the glass substrate between the cassette station 12, treatment section 21, and washing unit 16.

The cassette station 12 includes two cassette stage sections 12a that are arranged along the transportation path A. Each stage section 12a removably carries thereon a cassette C, which stores a plurality of glass substrates 1 stacked in layers. The transportation device 7 is provided with a transfer vehicle 7a that runs self-propelled along the transportation path A. The vehicle 7a carries thereon and automatically delivers the cassettes C to a cassette station of any of the treatment devices.

Figure 4:
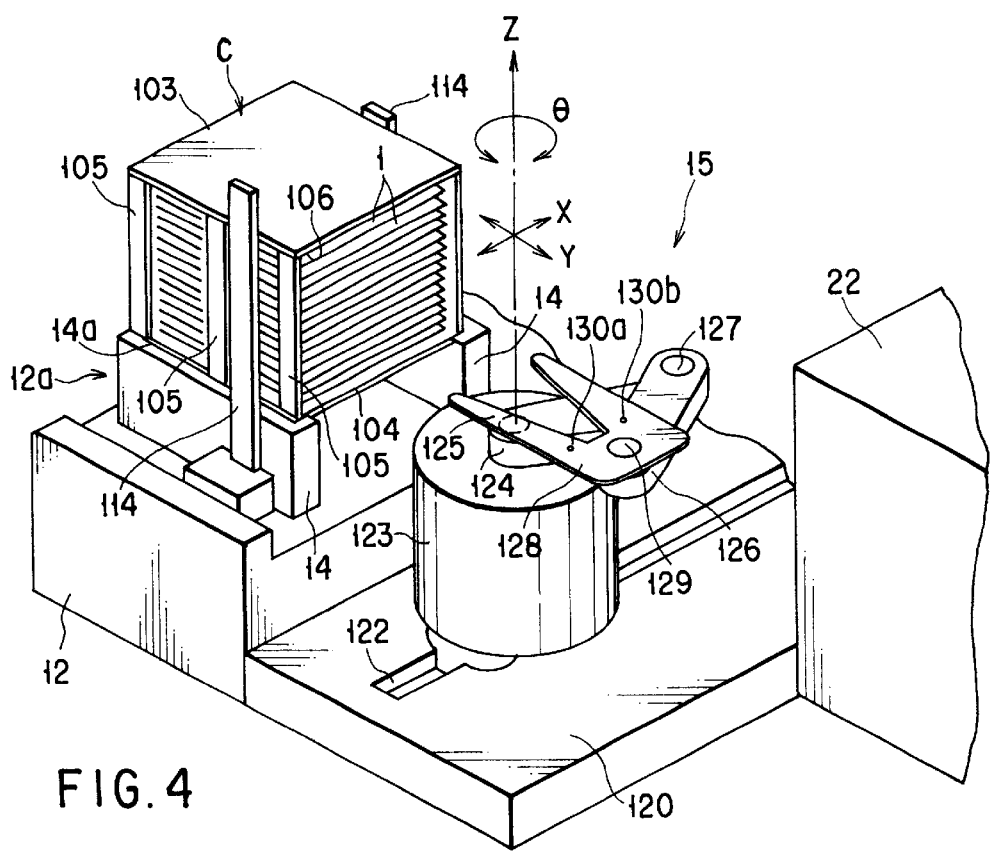
Figure 5:
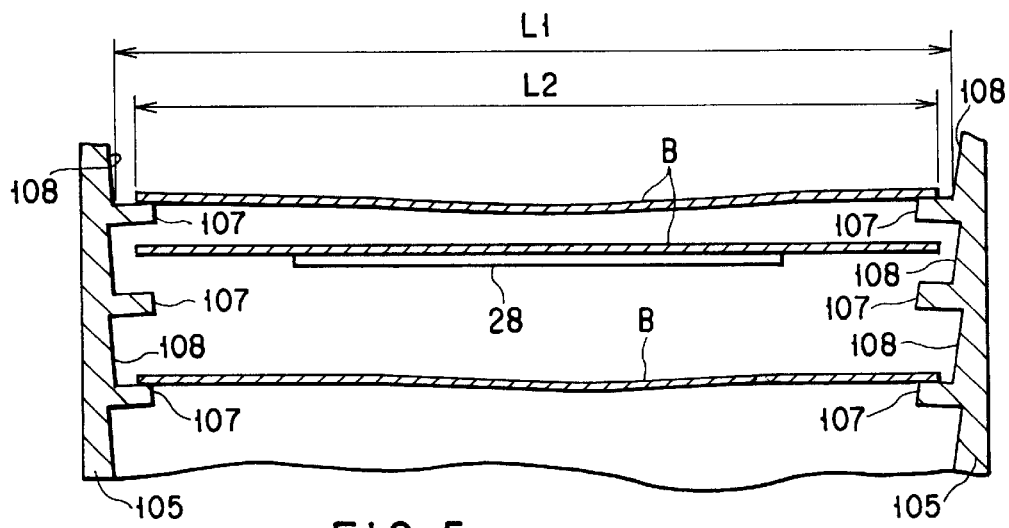

As shown in FIGS. 4 and 5, each glass substrate 1 is in the form of a rectangle that is 500 mm long, 400 mm wide, and 0.7 mm thick, for example. Each cassette C is a box that is composed of a top plate 103, a bottom plate 104, a plurality of side plates 105, and a back plates (not shown). Formed in the front face of the cassette C is an opening 106 through which the glass substrates 1 are loaded into or unloaded from the cassette. As shown in FIG. 5, a plurality of ledges 107 protrude from the inner surface of each side plate 105. The ledges 107 are arranged vertically at predetermined intervals. Each glass substrate 1 is supported horizontally in the cassette C with its opposite side edge portions placed individually on the opposite ledges 107. A large number of glass substrates 1 are stored vertically in layers in the cassette C.

An inner surface 108 of each side plate 105 in each stage is formed having a given clearance from its corresponding side edge of the glass substrate 1 so that the substrate 1 can be prevented from touching the inner surface 108 as it is loaded into or unloaded from the cassette C. Thus, a distance L1 between the opposite inner surfaces is greater than a width L2 of the substrate 1 (L1>L2).

As shown in FIGS. 2 to 4, each cassette stage section 12a in the cassette station 12 is composed of a pair of support legs 14 that are set up on the top surface of the station 12. The legs 14 extend parallel to each other in a Y-direction that is perpendicular to the transportation path A. Formed on the upper end face of each leg 14, moreover, is a positioning groove 14a that extends in the Y-direction. The cassette C is positioned with respect to the cassette stage section 12a in a manner such that two opposite side edge portions of its bottom plate 104 are fitted individually in the positioning grooves 14a. When the cassette C is set on the stage section 12a, the opening 106 of the cassette C opens in the Y-direction toward the treatment section 21. Two cassettes C placed individually on the two cassette stage sections 12a are situated in the extending direction of the transportation path A or an X-direction, and their respective central axes D extend parallel to the Y-direction.

Figure 6:
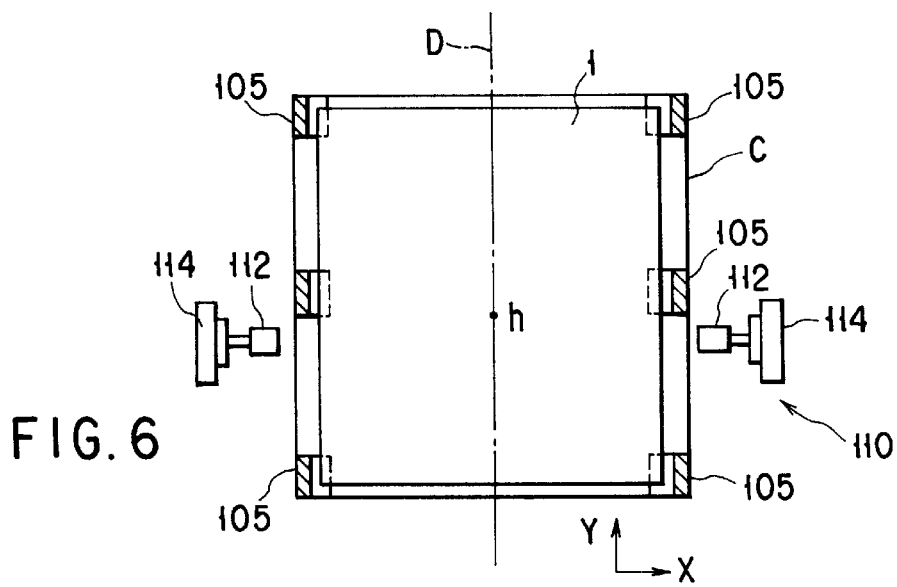
Figure 7A:
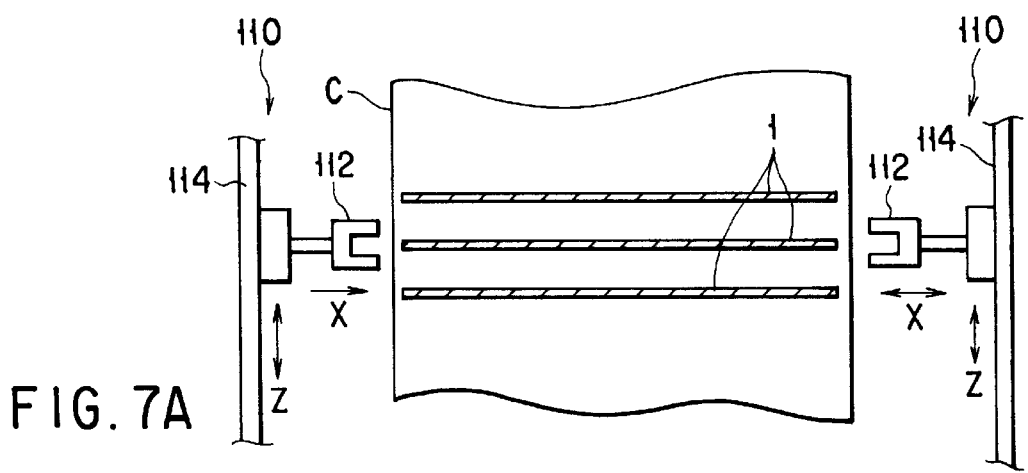
FIG. 7A is a sectional view schematically showing the positional relation between the glass substrate and the position sensors in a standby position.

As shown in FIGS. 4, 6 and 7A, each cassette stage section 12a is provided with a position detecting section 110 for detecting the position of each glass substrate 1 in the cassette C placed thereon. The detecting section 110 includes a pair of position sensors 112 for individually detecting the respective positions of a pair of side edges of the substrate 1 that extend in the Y-direction. In the cassette station 12, moreover, a pair of support posts 114 are set up substantially vertically near their corresponding cassette stage sections 12a. The posts 114 are arranged in the X-direction, facing each other with the stage sections 12a between them. The position sensors 112 are supported individually by the support posts 114 so that they can move up and down in the vertical direction or Z-direction. In addition, each of the sensors 112 is movable in the X-direction between a retreated position in which it is situated outside the cassette C and a detecting position in which it is situated overlapping the side edge of any one of the glass substrates 1. The position sensors 112 are located in positions such that a line that connects them passes substantially through a center h of the substrate 1.

Figure 7B:
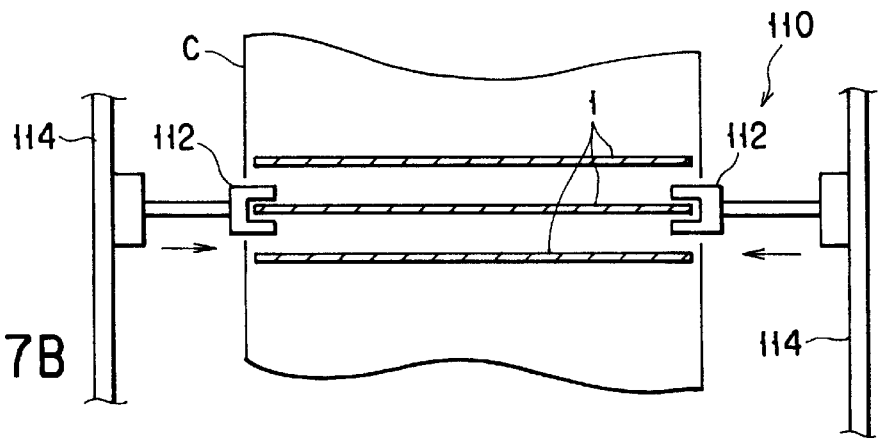
FIG. 7B is a sectional view schematically showing the positional relation between the glass substrate and the position sensors in a detecting position.

In detecting the position of the glass substrate 1, the position sensors 112 in the retreated positions are moved in the Z-direction to a position such that they individually face the opposite side edges of any glass substrate, especially the glass substrate 1 that is to be taken out of the cassette C by means of the transfer robot 15, which will be mentioned later. Subsequently, each position sensor 112 is moved in the X-direction from the retreated position toward the glass substrate 1, and is stopped when it detects its corresponding side edge of the substrate 1, as shown in FIG. 7B. As this is done, the movement of each position sensor 112 is detected. The position of the glass substrate 1 is detected in accordance with the respective movements of the sensors 112.

Thus, if the respective movements of the two position sensors 112 are equal, it is indicated that the glass substrate 1 is located with its center h in alignment with the central axis D of the cassette C. If the respective movements of the sensors 112 are different, their difference indicates that the glass substrate 1 is located with its central axis deviated in the X-direction from the central axis D of the cassette C. At the same time, the deviation can be detected. The deviation of the glass substrate 1 detected in this manner can be utilized as position information when the glass substrate is transported in the manner described later.

As shown in FIGS. 2 and 3, on the other hand, the treatment section 21 of the film forming device 2 is located side by side with the cassette station 12 in the Y-direction. The treatment section 21, which is of a multi-chamber type, is provided with a load-locking chamber 22 that can be controlled for the atmospheric pressure or vacuum. The chamber 22 extends in the Y-direction, having one end thereof opposed to the cassette station 12. A vacuum transfer chamber 24 having a substantially hexagonal plane shape is located on the other end side of the load-locking chamber 22 in a manner such that one side thereof is in contact with the chamber 22. A heating chamber 26 for heating the glass substrate 1 and four film forming chambers 25 for forming a thin film on the substrate 1 by chemical vapor deposition are provided individually on the other five sides of the vacuum transfer chamber 24. The chambers 26 and 25 function as separate treatment sections, and each of the film forming chambers is depressurized.

The spin-washing unit 16 of the film forming device 2 serves to clean the glass substrate 1 taken out of the cassette C by spin-washing. The unit 16 is arranged adjacent to the cassette station 12 and the treatment section 21, and is deviated from a space between itself and the station 12 in a second direction or X-direction perpendicular to a first direction or Y-direction passing through the station 12 and the section 21 are connected.

Further, the transfer robot 15 of the film forming device 2 is provided between the cassette station 12 and the load-locking chamber 22 of the treatment section 21. The robot 15 takes out the glass substrate 1 from the cassette C and loads it into the spin-washing unit 16. After the substrate 1 is washed, the robot 15 loads it into the treatment section 21 through the chamber 22. When a film is formed on the glass substrate 1 in the section 21, the robot 15 takes out the substrate and returns it to the cassette C.

Figure 8:
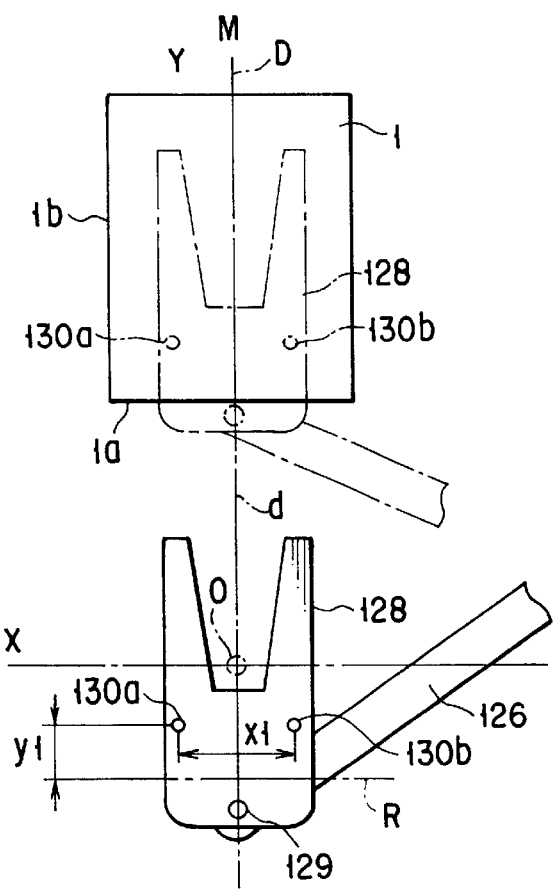

The transfer robot 15, which serves as a transportation mechanism, is provided with a hand 128 as a support member for supporting the glass substrate 1, as shown in FIGS. 2 and 8. The hand 128 is designed so that it can move in two directions across a center point O within a horizontal plane, that is, in the X- and Y-directions, and ascend and descend in the vertical direction or Z-direction across the center point O. Further, the hand 128 is rockable around the Z-axis.

More specifically, the transfer robot 15 includes a base 120 provided between the cassette station 12 and the load-locking chamber 22 of the treatment section 21 and a driving section 123 movable along a guide groove 122, which is formed in the base 120 and extends in the X-direction. The groove 122 extends in a direction across the center of the spin-washing unit 16. The driving section 123, for use as drive means, includes a rotating shaft 125, which can ascend and descend along the Z-axis and rotate in the θ-direction around the Z-axis. The shaft 125 is in alignment with the center point O. Further, the driving section 123 is located on the base 120 so that it can turn itself around the Z-axis.

One end portion of a first arm 124 is connected to the rotating shaft 125 so that the arm 124 is rockable integrally with the shaft 125. One end of a second arm 126 is connected to the other end of the first arm 124 for rotation around a rotating shaft 127. The hand 128 for carrying the glass substrate 1 is connected to the other end of the second arm 126 for rotation around a rotating shaft 129. The first and second arms 124 and 126 constitute a link. As the first arm 124 rocks, the second arm 126 rocks for a given angle.

The hand 128 is formed of a thin plate that extends horizontally. The proximal end portion of the hand 128 is connected to the rotating shaft 129, and the distal end portion thereof is bifurcated right and left. The hand 128 is mounted on the rotating shaft 129 in a manner such that its center line d is in alignment with a movement axis M that extends across the shaft 129 and the center point O.

When the driving section 123 moves along the guide groove 122, the hand 128 moves in the X-direction. When the arms 124 and 126 ascend or descend together with the rotating shaft 125, the hand 128 moves in the Z-direction. When the first and second arms 124 and 126 are rocked by the rotating shaft 125, moreover, the hand 128 moves along the movement axis M with its center line d continually in alignment with the axis M. When the driving section 123 rocks around the center point O, furthermore, the hand 128 rocks together with the first and second arms 124 and 126 around the center point O.

The hand 128 is provided with first and second non-contact sensors 130a and 130b for detecting one side 1a of the glass substrate 1 on the opening side of the cassette C in two positions. The sensors 130a and 130b are of an optical reflector type, using infrared rays that have an optical focusing point such that they can be detected without being transmitted through the transparent glass substrate 1. The sensors 130a and 130b are arranged bisymmetrically with respect to the center line d (line that passes through the rotating shaft 29 and the center point O) of the hand 128, that is, on a line perpendicular to the center line d, with their detecting surfaces upward. For example, the sensors are arranged with a space x1 of 200 mm between them.

As mentioned later, moreover, a substrate mounting reference line R is set at a distance y1 of, for example, 100 mm from the first and second sensors 130a and 130b on the proximal side of the hand 128. As the glass substrate 1 is transported, it is supported on the hand 128 with its one end 1a in alignment with the reference line R.

Figure 9:
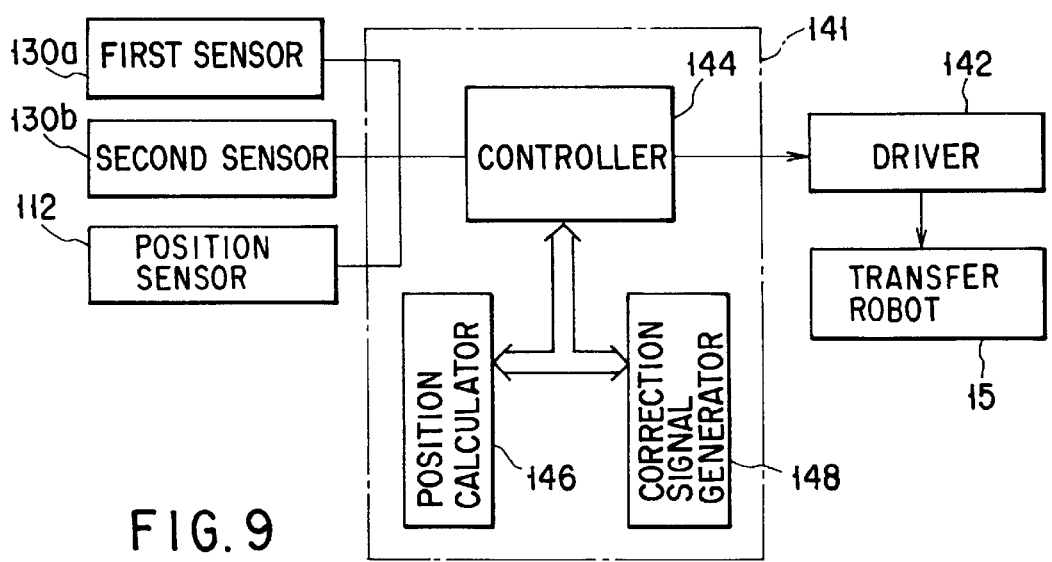

As shown in FIG. 9, the position sensors 112 and the first and second sensors 130a and 130b are connected to a control section 141, which functions as control means and adjusting means. Further, the control section 141 is connected with a driver 142 for driving the driving section 123 of the transfer robot 15. The control section 141 includes a main controller 144 for controlling the basic transporting operation of the robot 15, an arithmetic element 146 for calculating the relative positions of the hand 128 and the glass substrate 1 in accordance with information on the output signals of the sensors 112, 130a and 130b and the operating state of the robot 15, and a correcting section 148 for outputting a correction signal for correcting the transporting operation of the robot 15 in accordance with the calculated position.

The following is a description of the loading and unloading operations of the transfer robot 15 constructed in this manner. Let it be supposed that the cassettes C transported by the AGV 7 are placed individually on the cassette stage sections 12a, and that the glass substrates 1 are stored in layers in each cassette C. The hand 128 of the robot 15 is supposed to be located in its standby position.

In the standby position, as shown in FIG. 10A, the center point O of the transfer robot 15 is situated on the X-axis and a reference axis RY that extends coaxially with the central axis D of one cassette C. Further, the hand 128 is located in a position such that its center line d is in alignment with the reference axis RY, and the movement axis M of the hand 128 is also in alignment with the axis YR.

In taking out any one of the glass substrates 1 from the cassette, the position of the substrate 1 or a deviation of the center h of the substrate from the central axis D of the cassette C is detected by means of the position sensors 112 of the position detecting section 110 in the cassette station 12. If the center of the glass substrate 1 to be taken out is deviated from the central axis D by a distance a in the X-direction, the driving section 123 moves for the distance a in the X-direction, thereby correcting the deviation of the substrate 1. Thereupon, the reference axis RY of the transfer robot 15 and the center line d and movement axis M of the hand 128 pass through the center h of the glass substrate 1 and extend parallel to the central axis D of the cassette C, as shown in FIG. 10B.

Figure 11D:
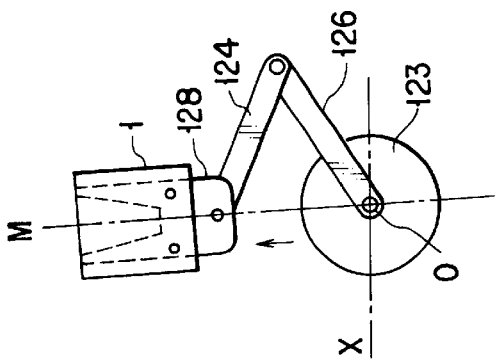
FIGS. 11A to 11G are plan views individually showing processes of transportation of the glass substrate by the transfer robot.
Figure 11C:
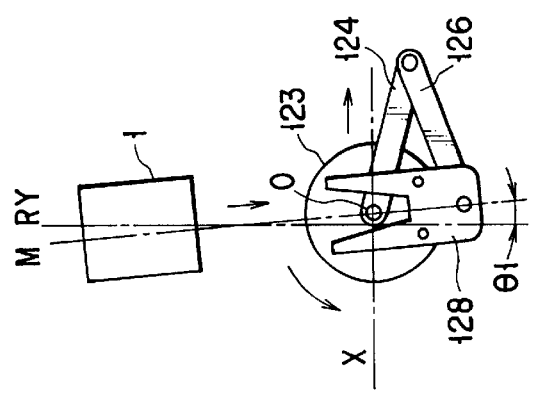
Figure 11B:
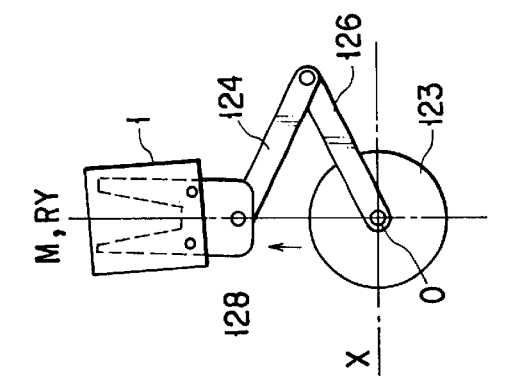
Figure 11A:
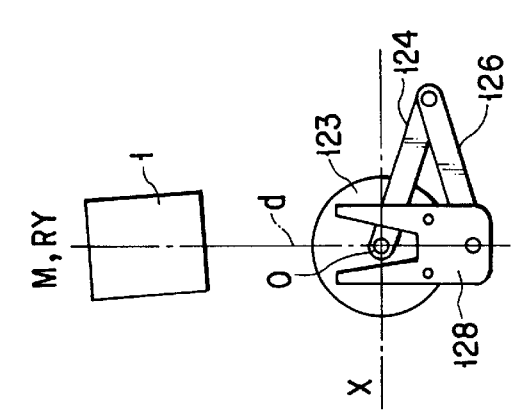
Figure 11G:
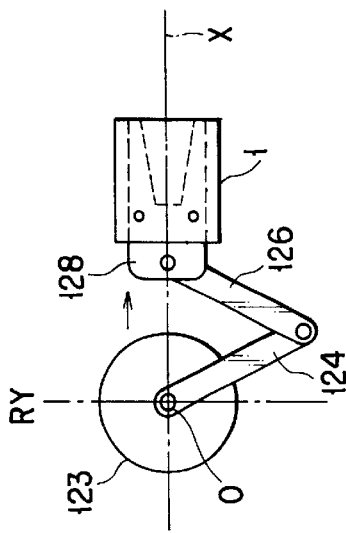

Subsequently, the transfer robot 15 moves the hand 128 in the Z-axis direction under the control of the control section 141, as shown in FIG. 11A, and stops at a height such that the hand 128 is situated under the glass substrate 1 to be taken out of the cassette C and that the space between the undersurface of the substrate 1 and the first and second sensors 130a and 130b is equal to a given distance or 8 mm in this case.

Then, the hand 128 is moved along the reference axis RY into the cassette C, as shown in FIGS. 11B and 12A, and gets into the space between the glass substrate 1 to be taken out and the glass substrate 1 thereunder or the bottom plate 104 of the cassette C. As the hand 128 gets under to the substrate 1 to be taken out, the first and second sensors 130a and 130b cross the region under the one side 1a of the substrate 1, and individually detect the side 1a and output detection signals.

If no detection signals are delivered from either of the first and second sensors 130a and 130b although the hand 128 is moved for a given distance, the control section 141 concludes that there is no glass substrate 1 in the cassette C and stops the transfer operation. If only one of the first and second sensors 130a and 130b outputs its detection signal, the control section 141 concludes that the glass substrate 1 is broken.

In response to the delivery of the detection signals from the first and second sensors 130a and 130b, the arithmetic element 146 of the control section 141 computes a Y-direction distance of movement y2 of the hand 128 covered during the time interval between the departure from the standby position and the detection of the one side 1a of the glass substrate 1 by the first sensor 130a and a Y-direction distance of movement y3 covered before the detection of the one side 1a by the second sensor 130b.

Based on the distances of movement y2 and y3, moreover, the control section 141 computes the inclination of the glass substrate 1, that is, an inclination θ1 of the substrate with respect to the reference axis RY, and the RY-direction (reference-axis-direction) position of the substrate 1 as one-side-position information. Based on this result of computation, the control section 141 computes the moving direction of the hand 128 corresponding to the inclination of the glass substrate 1 and the necessary distance of movement of the hand 128 for the alignment of the one side 1a of the substrate 1 with the substrate mounting reference line R of the hand 128.

After the control section 141 then returns the hand 128 to the standby position, it actuates the transfer robot 15 so that the hand 128 is situated in a predetermined position relative to the glass substrate 1. More specifically, as shown in FIGS. 11C and 12B, the control section 141 moves the driving section 123 to the right for a distance of movement x2 along the X-axis so that a line connecting the first and second sensors 130a and 130b extends parallel to the one side 1a of the glass substrate 1. Further, the control section 141 causes the driving section 123, along with the arms 124 and 126, to rotate for θ1 in the counterclockwise direction around the center point O. By doing this, the movement axis M and center line d of the hand 128 match the inclination of the glass substrate 1.

Then, the control section 141 computes a distance of movement y4 of the hand 128 in the direction of the movement axis M. The substrate mounting reference line R of the hand 128 is set at the distance y1 from the line that connects the first and second sensors 130a and 130b. Based on the result of computation, the control section 141 corrects data on the movement axis M and rocked position of the hand 128. Thereafter, the control section 141 controls the operation of the transfer robot 15 in accordance with the corrected data.

Under the control described above, the hand 128 moves to a predetermined mounting position corresponding to the takeout position for the glass substrate 1, and is stopped at the mounting position. Thereupon, the center line d of the hand 128 is aligned with the center line of the glass substrate 1, and the reference line R of the hand 128 with the one side 1a of the substrate 1.

In the case where the distances of movement y2 and y3 computed in accordance with the detection signals from the first and second sensors 130a and 130b are equal, that is, if the glass substrate 1 to be taken out is in its correct position such that its one side 1a extends at right angles to the central axis d of the hand 128, the angle of inclination of the substrate 1 is computed to be 0°, and the control section 141 moves the hand 128 along the reference axis RY to the predetermined mounting position without correcting its moving direction.

According to the present embodiment, the position of the hand 128 relative to the glass substrate 1 is corrected after the hand 128 is returned to the standby position. Alternatively, however, the hand 128 may be subjected to position correction without being returned to the standby position.

Subsequently, the transfer robot 15 raises the hand 128 for a given distance in the Z-direction. Thereupon, the hand 128 supports the glass substrate 1 and pushes it up to a height position at a given distance (gap) from the ledges 107 of the cassette C.

Figure 11F:
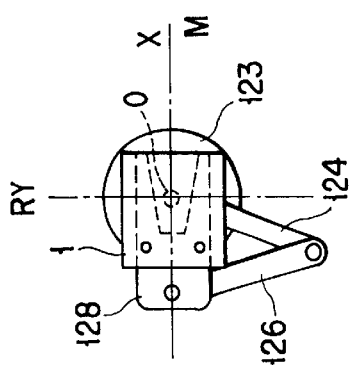
Figure 11E:
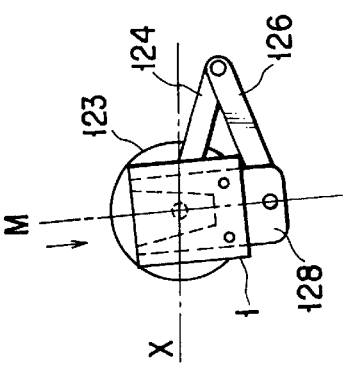

In this state, the transfer robot 15 moves the hand 128 along the movement axis M to a position over the driving section 123, as shown in FIG. 11E, and takes out the glass substrate 1 on the hand 128 from the cassette C. Then, the robot 15 rotates the driving section 123, along with the arms 124 and 126 and the hand 128, for 90°+θ1 in the clockwise direction around the center point O, thereby opposing the substrate 1 to the spin-washing unit 16 and aligning the center line of the substrate 1 with the X-axis, as shown in FIGS. 11F and 12C. At the same time, the hand 128 is moved in the Z-direction to be adjusted to a predetermined height position corresponding to the washing unit 16.

Further, the control section 141 moves the driving section 123 in a direction opposite to the correcting direction for a distance equal to an X-direction correction value a and x2 for the takeout of the glass substrate 1, thereby aligning the reference axis RY of the transfer robot 15 with the center line D of the cassette C, as shown in FIG. 12C.

Subsequently, the control section 141 moves the driving section 123 and the hand 128 for a given distance in the X-direction toward the spin-washing unit 16. In this state, the transfer robot 15 moves the hand 128 along the movement axis M or in the X-direction to the washing unit 16, thereby loading the glass substrate 1 on the hand 128 into a predetermined position in the unit 16, as shown in FIG. 11E. After loading the substrate 1 into the unit 16, the robot 15 is returned to the predetermined standby position.

When the spin-washing unit 16 finishes washing the glass substrate 1, as shown in FIG. 3, the transfer robot 15 takes out the substrate 1 from the unit 16 under the control of the control section 141, and moves it to a position opposite to the load-locking chamber 22 of the treatment section 21. Thereafter, the robot 15 loads the substrate 1 into the chamber 22 in the Y-direction. When film formation on the glass substrate 1 by the treatment section 21 is finished, moreover, the transfer robot 15 takes out the substrate 1 from the load-locking chamber 22, and moves in the X-direction to a position opposite to any of the cassettes C, thereby transporting the substrate 1. Thereafter, the robot 15 loads the substrate 1 onto specified ledges in the cassette C in the Y-direction.

In this manner, the transfer robot 15 transports the glass substrate 1 from the cassette C in the X-direction and loads it into the spin-washing unit 16. After the substrate 1 is washed, the robot 15 transports it in the Y-direction and loads it into treatment section 21. Further, the robot 15 transports the treated substrate 1 from the treatment section 21 in the Y-direction and returns it to the cassette C.

Figure 13:
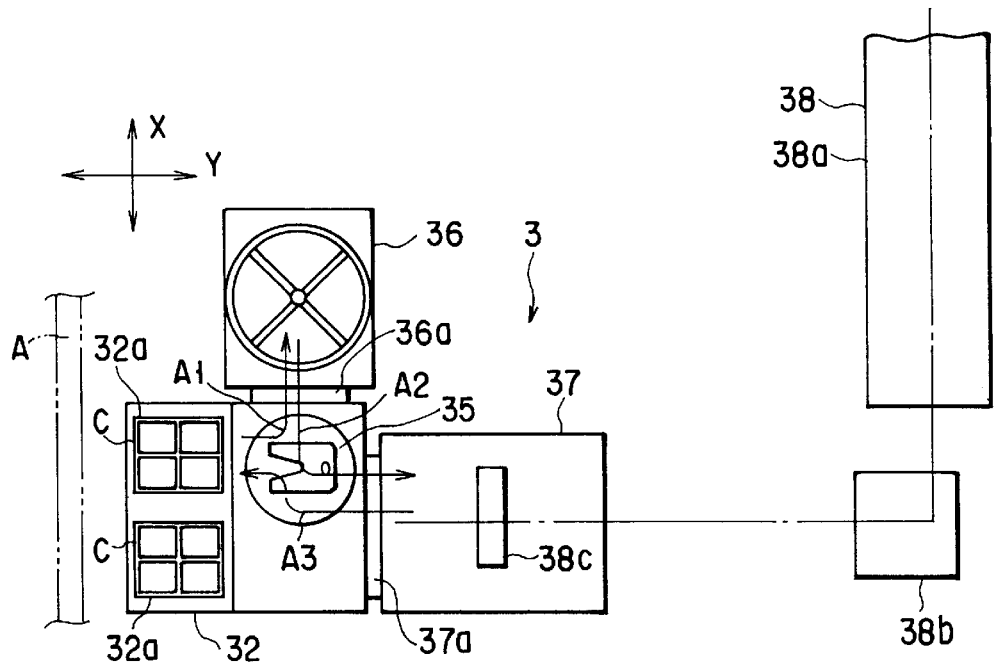

The following is a description of the laser annealing device 3 that is located side by side with the film forming device 2. As shown in FIGS. 1 and 13, the annealing device 3 includes a cassette station 32, an excimer-laser annealing (ELA) chamber 37 as a treatment section, a spin-washing unit 36, and a transfer robot 35. The cassette station 32 is opposed to the transportation path A of the transportation device 7. The annealing chamber 37 is opposed to the station 32 in the Y-direction perpendicular to the path A. The washing unit 36 is deviated from the line of arrangement of the station 32 and the chamber 37 in the X-direction along the transportation path A. The robot 35, which is located between the cassette station 32 and the annealing chamber 37, serves to transfer the glass substrate between the station 32, chamber 37, and unit 36.

The cassette station 32 includes two cassette stage sections 32a that are arranged along the transportation path A. Each stage section 32a is constructed in the same manner as each cassette stage section 12a of the film forming device 2. Each stage section 32a removably carries thereon a cassette C, which has the same construction as aforesaid and stores a plurality of glass substrates 1 stacked in layers.

A washing chamber of the spin-washing unit 36 is opposed to the transfer robot 35 through an openable gate 36a. The laser annealing chamber 37 is also opposed to the robot 35 through an openable gate 37a. With this arrangement, the transportation distance of the glass substrate 1 taken out of the cassette C can be minimized. Further, the gates 36a and 37a can separate atmospheres in the spin-washing unit 36 and the annealing chamber 37 from an atmosphere in a space for the cassette station 32 and the transfer robot 35.

The glass substrate 1 is taken out of the cassette C, transported in the X-direction, and loaded directly into the spin-washing unit 36 by the transfer robot 35, as indicated by arrow A1 in FIG. 13. After it is washed, the substrate 1 is taken out of the washing unit 36, transported in the X- and Y-directions, and loaded directly into the laser annealing chamber 37. As mentioned later, the substrate 1 subjected to laser annealing in the annealing chamber 37 is taken out of the chamber 37, transported in the Y-direction, and loaded into the cassette C by the robot 35.

Figure 14:
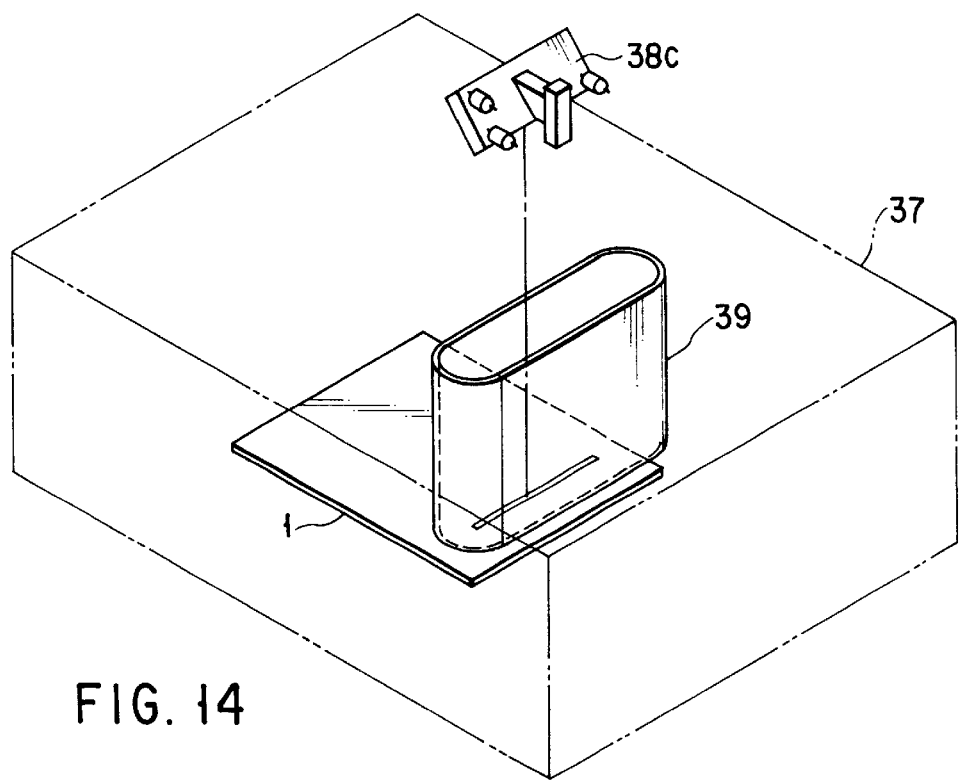
Figure 15:
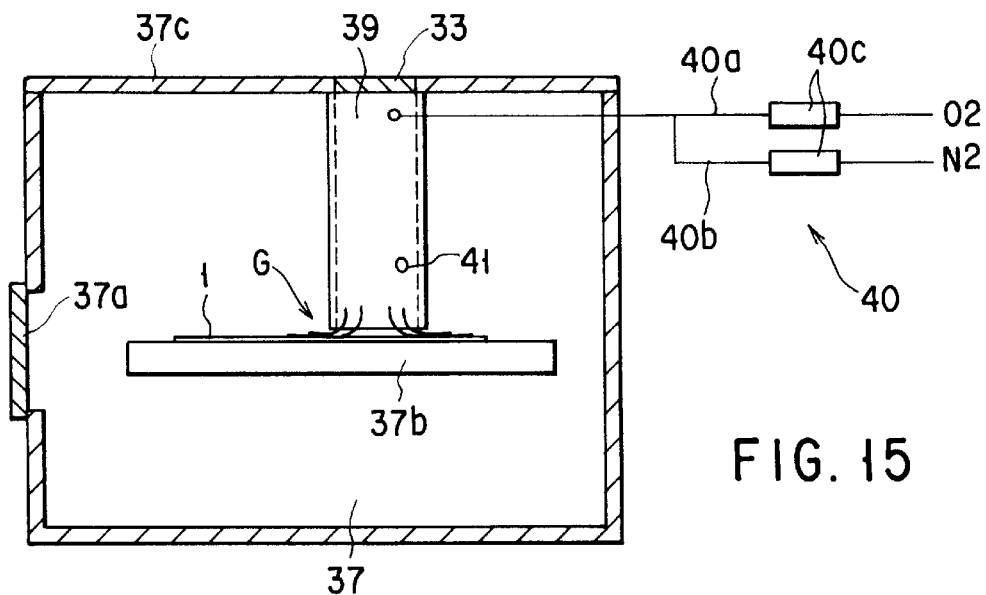

As shown in FIGS. 13 to 15, the laser annealing device 3 includes a laser generator 38 for applying an excimer laser to the annealing chamber 37. The generator 38 is provided with an excimer laser source 38a and an optical system including a beam homogenizer (not shown) for guiding a generated laser as a linear beam, optical mirrors 38b and 38c, and the like.

Arranged inside the annealing chamber 37 are a stage 37b for substantially horizontally supporting the glass substrate 1 and an atmosphere separating cover 39 situated over the substrate 1 that is supported on the stage 37b. The cover 39 is in the form of a cylinder having a flat elliptic cross section, and its upper end is airtightly fixed to the inner surface of a top wall 37c of the annealing chamber 37. A top opening of the cover 39 faces a laser window 33, which is formed of a quartz glass or the like embedded in the top wall 37c. A bottom opening of the cover 39 faces a laser irradiation region of the glass substrate 1 on the stage 37b across a narrow gap G.

The excimer laser generated from the laser generator 38 is reflected by the optical mirrors 38b and 38c of the optical system, projected on the inside of the atmosphere separating cover 39 through the laser window 33, and applied to the glass substrate 1 through the cover 39.

Gases from a gas supply section 40 outside the annealing chamber 37 are supplied to the inside of the atmosphere separating cover 39. The supply section 40 is a gas control system that supplies the gases to the inside of the cover 39 to control the atmosphere. The gas supply section 40 includes pipes 40a and 40b for supplying, for example, nitrogen ($N_2$) and oxygen ($O_2$), gas control sections 40c, such as solenoid valves, for opening and closing the pipes 40a and 40b to regulate the flow rates of the gases, and a concentration sensor 41 for detecting the oxygen concentration of the atmosphere inside the atmosphere separating cover 39. The supply section 40 adjusts the atmosphere inside the cover 39 or in the laser irradiation region of the surface of the glass substrate 1 to a given oxygen concentration.

For example, a nitrogen atmosphere may be used having the oxygen concentration at 0.1% to 13%, preferably at 1.0% to 7.0%.

According to the embodiment described above, oxygen and nitrogen are supplied separately. Alternatively, however, oxygen and nitrogen may be mixed to a predetermined oxygen concentration before they are supplied. It is necessary only that the oxygen concentration of the atmosphere be kept at a given value at least in a region near the glass substrate surface inside the separating cover 39.

As shown in FIG. 1, the dry etching device 4 is located in line with the film forming device 2 and the laser annealing device 3 along the transportation path A. The device 4 includes a cassette station 42, a dry etching chamber 47 and a spin-washing unit 46 as treatment sections, and a transfer robot 45. The cassette station 42 is opposed to the transportation path A. The chamber 47 and the unit 46 are opposed to the station 42 in the Y-direction perpendicular to the path A. The robot 45, which is located between the cassette station 42 on one side and the dry etching chamber 47 and the spin-washing unit 46 on the other side, serves to transfer the glass substrate between the station 42, chamber 47, and unit 46.

The cassette station 42 includes two cassette stage sections that are arranged along the transportation path A. Each stage section is constructed in the same manner as each cassette stage section 12a of the film forming device 2. Each stage section removably carries thereon a cassette C, which has the same construction as aforesaid and stores a plurality of glass substrates 1 stacked in layers.

In the dry etching device 4, the glass substrate 1 is taken out of the cassette C, transported in the Y-direction, and loaded into the spin-washing unit 46 by the transfer robot 45. After it is washed, the substrate 1 is taken out of the washing unit 46, transported in the X- and Y-directions, and loaded directly into the dry etching chamber 47. In the chamber 47, a film formed on the substrate 1 is subjected to dry etching. The etched substrate 1 is taken out of the chamber 47, transported in the Y-direction, and loaded into the cassette C by the robot 45.

As shown in FIG. 1, the ion doping device 5 is located in line with the dry etching device 4 along the transportation path A. The device 5 includes a cassette station 52, an ion doping chamber 57 and a spin-washing unit 56 as treatment sections, and a transfer robot 55. The cassette station 52 is opposed to the transportation path A. The chamber 57 and the unit 56 are opposed to the station 52 in the Y-direction perpendicular to the path A. The robot 55, which is located between the cassette station 52 on one side and the ion doping chamber 57 and the spin-washing unit 56 on the other side, serves to transfer the glass substrate between the station 52, chamber 57, and unit 56.

The cassette station 52 includes two cassette stage sections that are arranged along the transportation path A. Each stage section is constructed in the same manner as each cassette stage section 12a of the film forming device 2. Each stage section removably carries thereon a cassette C, which has the same construction as aforesaid and stores a plurality of glass substrates 1 stacked in layers.

In the ion doping device 5, the glass substrate 1 is taken out of the cassette C, transported in the Y-direction, and loaded into the spin-washing unit 56 by the transfer robot 55. After it is washed, the substrate 1 is taken out of the washing unit 56, transported in the X- and Y-directions, and loaded directly into the ion doping chamber 57. In the chamber 57, a film formed on the substrate 1 is doped with ions. The doped substrate 1 is taken out of the chamber 57, transported in the Y-direction, and loaded into the cassette C by the robot 55.

Figure 16:
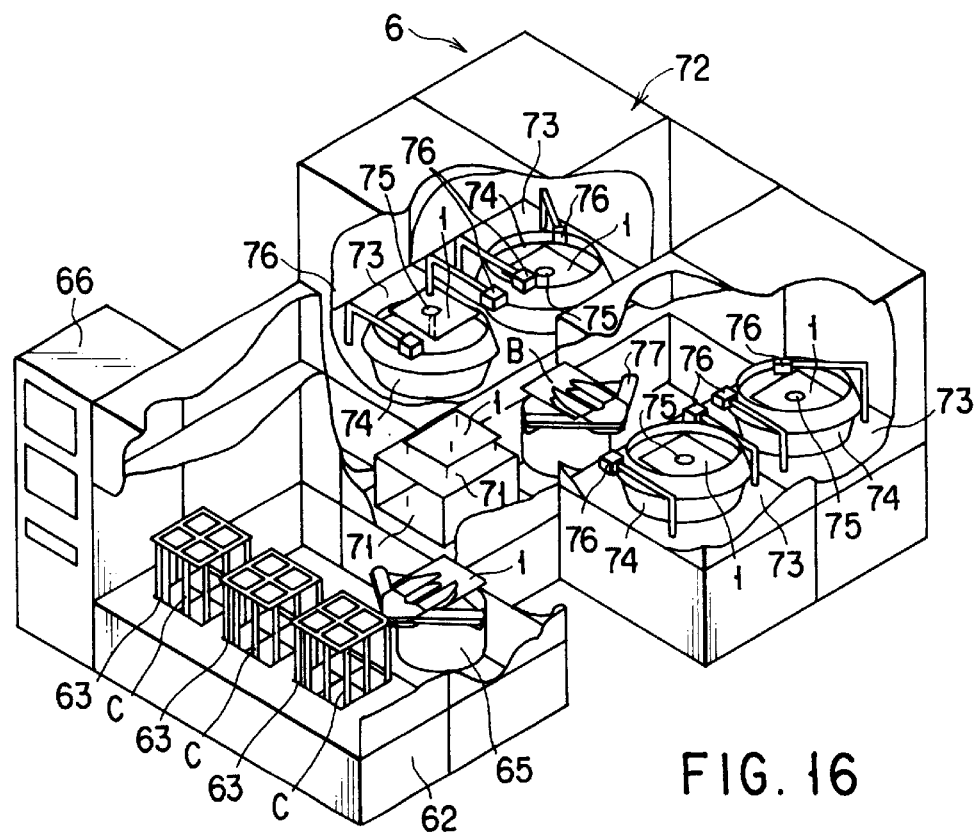

As shown in FIGS. 1 and 16, the wet etching device 6 is located in line with the ion doping device 5 along the transportation path A. The device 6 includes a cassette station 62, a standby stage 71, a treatment section 72, and a transfer robot 65. The cassette station 62 is opposed to the transportation path A. The stage 71 is opposed to the station 62 in the Y-direction perpendicular to the path A. The section 72 is located side by side with the stage 71 in the Y-direction. The robot 65, which is located between the standby stage 71 and the cassette station .62, serves to transfer the glass substrate 1 between the station 62 and the stage 71.

The cassette station 62 includes three cassette stage sections 63 that are arranged along the transportation path A. Each stage section 63 is constructed in the same manner as each cassette stage section 12a of the film forming device 2. Each stage section 63 removably carries thereon a cassette C, which has the same construction as aforesaid and stores a plurality of glass substrates 1 stacked in layers. A control panel 66 is located beside the cassette station 62.

The standby stage 71 is composed of two tiers, upper and lower. The transfer robot 65 loads the glass substrate 1 taken out of the cassette C into the stage 71 in the Y-direction, takes out the treated substrate 1 from the stage 71, and loads it into the cassette C in the Y-direction. The robot 65 is constructed substantially in the same manner as the transfer robot of the film forming device 2.

The treatment section 72 is provided with four square medical fluid treatment sections 73 as separate treatment sections. Each treatment section 73 includes a cup 74 having a diameter greater than the diagonal of the glass substrate 1. A substrate chuck 75 is provided in the center of the cup 74.

The chuck 75, which can rotate and move up and down holding the substrate 1, can adjust the substrate 1 to the same temperature as a medical fluid. Rotatable medical fluid nozzles 76 are arranged over the cups 74, and a transfer robot 77 is located in the center of the four medical fluid treatment sections 73.

The four medical fluid treatment sections 73 are provided with a control system for controlling their temperatures and other factors as a whole or individually. The treatment sections 73 are capable of spin drying or air-blow drying.

Figure 17:
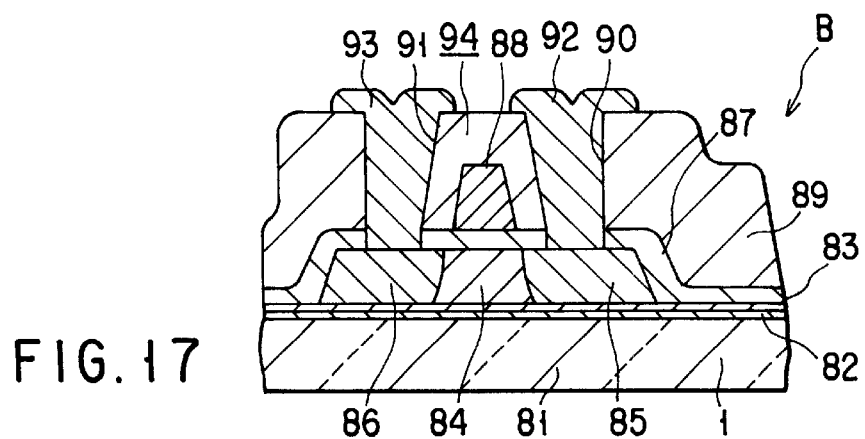
FIG. 17 is a sectional view showing an example of an array substrate manufactured by means of the substrate manufacturing apparatus.

The following is a description of an arrangement of the array substrate manufactured by the substrate manufacturing apparatus connected in this manner. As shown in FIG. 17, an array substrate B comprises a glass substrate 1 as an insulated substrate. Protective films 82 of $SiN_x$ and SiON are successively formed in layers on the substrate 1. A channel region 84, drain region 85, and source region 86 of polysilicon (p-Si) are formed on the film 83. The regions 85 and 86 are situated individually on the opposite sides of the channel region 84.

A gate insulating film 87 of $SiO_2$ or TEOS is formed on the channel, drain, and source regions 84, 85 and 86, and a metallic gate electrode 88 of aluminum or aluminum alloy is formed on the insulating film 87. An interlayer insulating film 89 of $SiN_x$ is formed covering the film 87 and the electrode 88. The films 89 and 87 are formed having contact holes 90 and 91, respectively. A drain electrode 92 and a source electrode 93 of aluminum or aluminum alloy are formed penetrating the holes 90 and 91, respectively. The electrodes 92 and 93 constitute a thin-film transistor 94. The array substrate B further comprises pixel electrodes, signal lines, scanning lines, etc., which are not shown.

The following is a description of processes for manufacturing the array substrate B by using the above-described substrate manufacturing apparatus.

First, the glass substrate 1 stored in the cassette C is transported along the transportation path A to a position where it faces the cassette station 12 of the film forming device 2. Thereafter, the cassette C is transferred to the cassette stage section 12a of the station 12.

After the glass substrate 1 is then taken out in the Y-direction from the cassette C by means of the transfer robot 15, it is loaded into the spin-washing unit 16 that is situated in the X-direction perpendicular to the Y-direction. The substrate 1 is washed by means of the washing unit 16. Subsequently, the washed glass substrate 1 is taken out in the X-direction from the unit 16 by means of the robot 15, and is then loaded into the load-locking chamber 22 of the treatment section 21 in the Y-direction within 20 seconds, preferably 10 seconds.

Figure 18A:
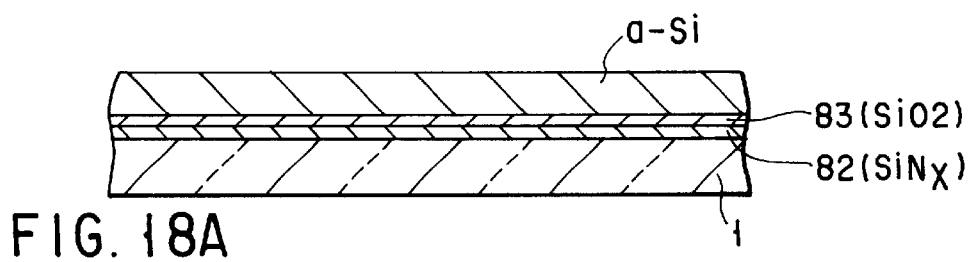
FIGS. 18A to 18C are sectional views individually showing processes of manufacture of the array substrate by the substrate manufacturing apparatus.

When loaded with the glass substrate 1, the load-locking chamber 22 is decompressed to a vacuum from the atmospheric pressure. Then, the substrate 1 is transferred from the chamber 22 to the heating chamber 26 through the vacuum transfer chamber 24 by means of the transfer robot (not shown), and is heated at a given temperature for a given time in the chamber 26. Thereafter, the glass substrate 1 is transferred from the heating chamber 26 to the different film forming chambers 25 in succession through the vacuum transfer chamber 24. Thereupon, $SiN_x$ and SiON films for the protective films 82 and 83 and an amorphous silicon (a-Si) film for the channel, drain, and source regions 84, 85 and 86 are successively formed on the substrate 1 in the film forming chambers, as shown in FIG. 18A.

The glass substrate 1, having the $SiN_x$, SiON, and a-Si films thereon, is transported to the load-locking chamber 22 by means of the vacuum transfer chamber 24. After the chamber 22 is restored from the vacuum to the atmospheric pressure, the substrate 1 is transported in the Y-direction to be returned to the cassette C by the transfer robot 15.

After the film forming process is finished for all the glass substrates 1 in the cassette C, the cassette C is transferred to the transfer vehicle 7a and transported along the transportation path A to a position where it faces the cassette station 32 of the laser annealing device 3. Further, the cassette C is transferred to one of the cassette stage sections 32a of the station 32.

In the laser annealing device 3, each glass substrate 1 is taken out of the cassette C and loaded directly into the spin-washing unit 36 by the transfer robot 35, as indicated by arrow A1 in FIG. 13. In the washing unit 36, pretreatments, such as removal of particles, removal of phosphorus, boron, and other impurities, are carried out.

After the pretreatments are finished, the transfer robot 35 takes out the glass substrate 1 from the spin-washing unit 36, transports it in the X- and Y-directions, and loads it directly into the annealing chamber 37 through the open gate 37a, as indicated by arrow A2 in FIG. 13. The time for the transportation from the washing unit 36 to the annealing chamber 37 is not longer than about 20 seconds, preferably about 10 seconds. Accordingly, the time for the transfer of the substrate 1 to the annealing chamber 37 immediately after the end of the pretreatments is constant and very short, so that the probability of impurities, such as phosphorus, boron, etc., or particles adhering again to the glass substrate is minimized. Since the glass substrate 1 is transferred between the unit 36 and the chamber 37 only once by the transfer robot 35, moreover, the probability of particles adhering to the substrate 1 is low.

In the annealing chamber 37, as shown in FIG. 15, the glass substrate 1 is mounted in a predetermined position on the stage 37b, and the atmosphere separating cover 39 is situated over the substrate 1 with the narrow gap G between the two. In this state, the gas supply section 40 supplies the gases to the inside of the cover 39 in accordance with measurement data obtained by means of the oxygen concentration sensor 41, thereby controlling the atmosphere near the laser irradiation region on the glass substrate 1, e.g., oxygen concentration, to be a fixed value. In consequence, the atmosphere of the annealing chamber 37 is not a vacuum atmosphere, but is at a pressure not lower than normal pressure, that is, at normal pressure or a given positive pressure.

Figure 18B:
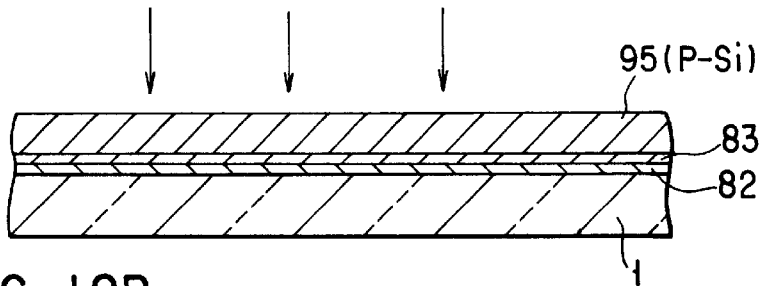

In this state, an excimer laser is generated from the laser generator 38, guided as a linear beam by means of the optical system, transmitted through the laser window 33 and the atmosphere separating cover 39, and applied to the glass substrate 1. The glass substrate 1 is gradually moved by a predetermined distance so that the respective regions applied with the linear beams are partially overlapped with each other. More specifically, as shown in FIG. 18B, the a-Si layer formed on the substrate 1 is annealed by means of the excimer laser and crystallized into a poly-silicon (p-Si) film 95 for forming the channel, drain, and source regions 84, 85 and 86. Thereafter, the glass substrate 1, having the crystallized p-Si film thereon, is returned to the cassette C by the transfer robot 35, as indicated by arrow A3 in FIG. 13.

After the laser annealing process is finished for all the glass substrates 1 in the cassette C, the cassette C is transferred to the transfer vehicle 7a and transported along the transportation path A to a photo-etching device (not shown). By a photo-etching process, a resist is formed on the channel, drain, and source regions 84, 85 and 86.

Figure 18C:
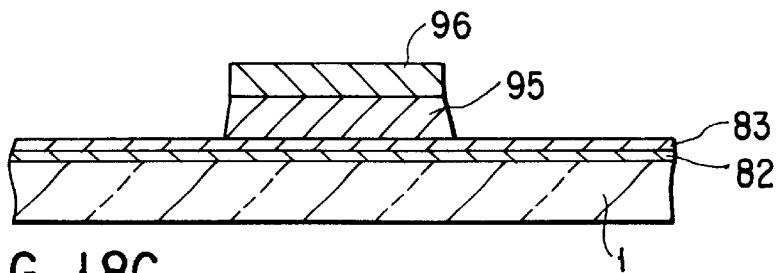

Thereafter, the cassette C is transported by means of the transfer vehicle 7a to a position where it faces the cassette station 42 of the dry etching device 4. Further, the cassette C is transferred to one of the cassette stage sections of the station 42. In the dry etching device 4, each glass substrate 1 is taken out of the cassette C and loaded directly into the spin-washing unit 36 by the transfer robot 45. After the substrate 1, washed in the unit 36, is then loaded directly into the dry etching chamber 47 by the robot 45, a resist 96 and the p-Si film 95 are dry-etched in the form of an island, as shown in FIG. 18C. Thereafter, the glass substrate 1 is returned to the cassette C by the robot 45.

After the dry etching process is finished for all the glass substrates 1 in the cassette C, the cassette C is transferred to the transfer vehicle 7a and transported along the transportation path A to a position where it faces the cassette station of the next film forming device (not shown). Thereafter, the cassette C is placed on one of the cassette stage sections of this station. This film forming device is constructed in the same manner as the film forming device 2.

Figure 19A:
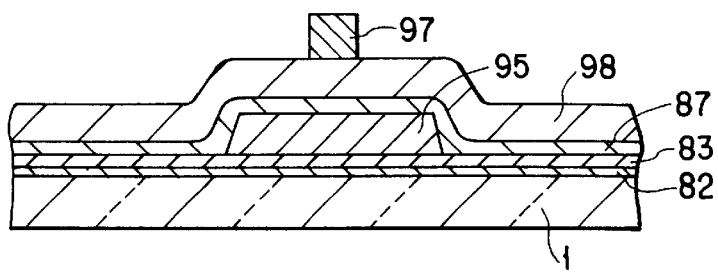
FIGS. 19A to 19E are sectional views individually showing further processes of manufacture of the array substrate by the substrate manufacturing apparatus.

In this film forming device, each glass substrate 1 from the cassette C is loaded into a spin-washing unit by a transfer robot. After it is washed, the substrate 1 is transferred directly from the washing unit to a load-locking chamber. After the substrate 1 is then heated in a heating chamber, it is transferred from the heating chamber to different film forming chambers in succession through a vacuum transfer chamber. Thereupon, an $SiO_2$ film for the insulating film 87 and a film of metal (MoW) for the gate electrode 88 are successively formed on the island-shaped p-Si film 95, as shown in FIG. 19A.

The glass substrate 1, having the $SiO_2$ film and the metal film thereon, is transported to the load-locking chamber through the vacuum transfer chamber. After the atmosphere is restored from the vacuum to the atmospheric pressure, the substrate 1 is returned to the cassette C by the transfer robot.

After this film forming process is finished for all the glass substrates 1 in the cassette C, the cassette C is transferred to the transfer vehicle 7a and transported along the transportation path A to the photo-etching device (not shown). By a photo-etching process, an island-shaped resist 97 is formed on the gate insulating film 87 and the gate electrode 88, as shown in FIG. 19A. Thereafter, the cassette C is transported by means of the truck 7a to a position where it faces the cassette station of another dry etching device (not shown) that has the same construction as the dry etching device 2. Further, the cassette C is transferred to one of the cassette stage sections of this station.

Figure 19B:
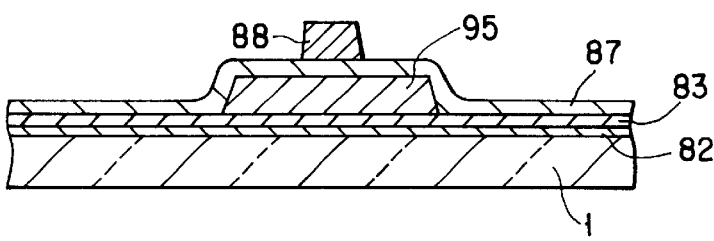

In this dry etching device, each glass substrate 1 is taken out of the cassette C and loaded directly into a spin-washing unit by a transfer robot. After the substrate 1, washed in the washing unit, is then loaded directly into a dry etching chamber by the robot, the gate electrode 88 is dry-etched into the form of an island, as shown in FIG. 19B. Thereafter, the glass substrate 1 is returned to the cassette C by the transfer robot.

After this dry etching process is finished for all the glass substrates 1 in the cassette C, the cassette C is transferred to the transfer vehicle 7a and transported along the transportation path A to a position where it faces the cassette station 32 of the laser annealing device 3. Further, the cassette C is transferred to one of the cassette stage sections of the cassette station 52 of the ion doping device 5.

Figure 19C:
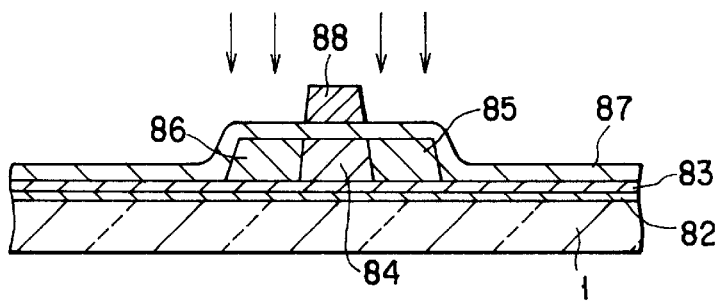

In the ion doping device 5, each glass substrate 1 is taken out of the cassette C and loaded into the spin-washing unit 56 by the transfer robot 55. The washed substrate I is loaded directly into the ion doping chamber 57 by the robot 55. In the chamber 57, the p-Si film 95 is doped with ions with the gate electrode 88 used as a mask, as shown in FIG. 19C. In this case, the channel region 84 is not ion-doped due to self-alignment of the gate electrode 88, and only the drain and source regions 85 and 86 are doped with ions. If necessary, the p-Si film may be formed having an LDD (lightly doped drain) structure by using a resist or metal film as a mask. The glass substrate 1, having its drain and source regions 85 and 86 doped with ions, is returned to the cassette C by the transfer robot 55.

After this ion doping process is finished for all the glass substrates 1 in the cassette C, the cassette C is transferred to the transfer vehicle 7a and transported along the transportation path A to a film forming device (not shown), and the interlayer insulating film 89 is formed on the gate insulating film 87 and the gate electrode 88. Further, the cassette C is transferred to the truck 7a and transported along the path A to the photo-etching device (not shown). By a photo-etching process, a resist is formed covering those portions of the interlayer insulating film 89 which are expected to form the contact holes 90 and 91.

Thereafter, the cassette C is transferred to the transfer vehicle 7a and transported along the transportation path A to a position where it faces the cassette station 62 of the wet etching device 6. Further, the cassette C is transferred to one of the cassette stage sections 63 of the cassette station 62.

Figure 19D:
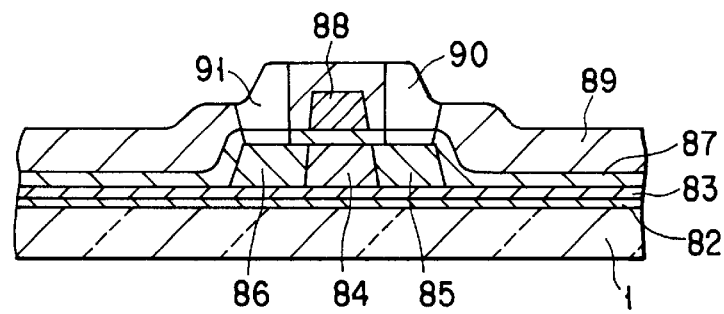

In the wet etching device, as shown in FIG. 16, the glass substrates 1 from the cassette C are load alternately onto the two tiers of the standby stage 71 by the transfer robot 65 and heated in the stage 71. Thereafter, the substrates 1 are successively transported by the transfer robot 77 to the two medical fluid treatment sections 73 that are supplied with a medical fluid for wet etching. In the treatment sections 73, the substrate chucks 75 holding the substrates 1 in a raised position are lowered so that the substrates 1 are situated individually in the cups 74. Further, the substrates 1 are rotated by means of the chucks 75 as the medical fluid for wet etching is supplied through the nozzles 76. Thereupon, the contact holes 90 and 91 are bored through the interlayer insulating film 89 and the gate insulating film 87, as shown in FIG. 19D.

Subsequently, the substrate chucks 75 are raised to lift the glass substrates 1, having the contact holes 90 and 91 therein, above the cups 74. Then, the substrates 1 are successively transferred by the transfer robot 77 from the medical fluid treatment sections 73 that are supplied with the medical fluid for wet etching to the other treatment sections 73 that are supplied with a medical fluid for resist separation. Then, the substrates 1 are held by means of the substrate chucks 76 to be situated in the cups 4, individually. Further, the substrates 1 are rotated by means of the chucks 75 as the medical fluid for resist separation is supplied thereto through the nozzles 76, whereupon the resist is separated. The medical fluids can be replaced with new ones without lowering the operating efficiency of the device if they are changed when the treatment sections 73 concerned are not loaded with any substrates 1.

The glass substrates 1, cleared of the resist, are transported to the standby stage 71 by the transfer robot 77 and further loaded into the cassette C by the transfer robot 65.

Subsequently, the cassette C is transported along the transportation path A by means of the transfer vehicle 7a of the transportation device 7 to a position where it faces the cassette station of the next film forming device, and is placed on one of the cassette stage sections of this station. This film forming device is constructed in the same manner as the aforementioned film forming device.

In this film forming device, each glass substrate 1 is taken out of the cassette C and loaded into the spin-washing unit 16 by the transfer robot 15. The washed substrate 1 from the unit 16 is loaded directly into the load-locking chamber 22 within 20 seconds, preferably 10 seconds. Then, the substrate 1 is transferred from the chamber 22 to the heating chamber 26 through the vacuum transfer chamber 24 and heated in the chamber 26. Thereafter, the glass substrate 1 is transferred from the heating chamber 26 to the different film forming chambers 25 in succession through the transfer chamber 24. Thereupon, a metal film for the drain and source electrodes 92 and 93 is formed on the interlayer insulating film 89 of the substrate 1.

Figure 19E:
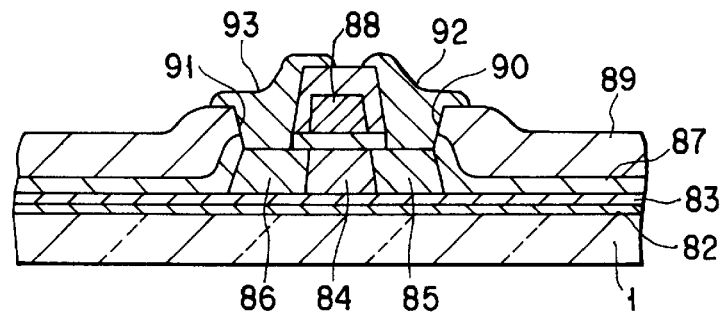

The glass substrate 1, having the metal film thereon, is transported to the load-locking chamber 22 through the vacuum transfer chamber 24, and is further returned to the cassette C by the transfer robot 15. The cassette C is carried out along the transportation path A by the transportation device 7, whereupon it advances to the next stage (not shown). After a resist is formed on the metal film on the substrate 1 in the next stage, the resulting structure is etched. By doing this, the drain and source electrodes 92 and 93 are formed, whereupon the array substrate B is completed, as shown in FIG. 19E.

According to the substrate manufacturing apparatus constructed in this manner, the film forming device 2, laser annealing device 3, dry etching device 4, and ion doping device 5 have their respective spin-washing units 16, 36, 46 and 56. In washing the substrates, therefore, the cassette C need not be transported to any other independent washing device, so that the washed substrates can be loaded directly into the respective treatment sections of the devices. Thus, desired treatments can be carried out in a short time after the substrates are washed, and the washed substrates can be loaded into the treatment sections without any substantial contamination. In consequence, the yield of array substrate production is improved, and the lead time can be shortened.

Since the substrates can be washed in the individual treatment sections 2, 3, 4 and 5, moreover, the transportation distance of the cassette C can be also shortened, the so-called Q-time can be managed with ease, and the whole manufacturing apparatus can be reduced in size.

In the film forming device 2, moreover, the spin-washing unit 16 is located in a dead space in the X-direction or the transportation direction of the transportation device 7, compared to the treatment section 21 that is located in the Y-direction perpendicular to the transportation direction of the device 7. Accordingly, a plurality of treatment sections can be arranged with higher efficiency, and the whole manufacturing apparatus can be reduced in size.

In the wet etching device 6, furthermore, the substrates are loaded individually into the four medical fluid treatment sections 73 by means of the transfer robot 77 that is movable over the range covering the treatment sections 73. Accordingly, the installation area can be reduced, and the substrates can be transferred easily and securely between the standby stage 71 and the medical fluid treatment sections.

According to the substrate manufacturing apparatus, moreover, the annealing chamber 37 of the laser annealing device is opposed directly to the transfer robot 15 so that the washed substrates can be loaded directly into the chamber 37. Therefore, the component units of the laser annealing device and the transportation mechanism parts between the component units can be reduced in number. Thus, the construction of the device can be simplified so that sources of particles can be reduced to ensure annealing in a stable atmosphere. In consequence, the quality of the substrates can be improved.

Further, the annealing chamber 37 is designed so that laser annealing can be carried out in an atmosphere at a pressure not lower than normal pressure, that is, at normal pressure or a given positive pressure, not in a vacuum atmosphere. Accordingly, there is no need of a vacuum pump or the like, so that the construction can be simplified, and therefore, the manufacturing costs can be reduced.

As mentioned before, moreover, the spin-washing unit 36 is connected directly to the cassette station 32. Therefore, the substrates can be transported to the annealing chamber 37 in a short time after carrying out pretreatments for annealing by means of the washing unit 36. Accordingly, laser annealing can be effected in a manner such that particles are removed, and that non-crystalline silicon is prevented from natural oxidation or impurities, such as boron, phosphorus, etc., are removed and prevented from adhering to the substrates. Thus, the state of the thin film is stabilized, so that the transistor characteristics and other properties of the substrates can be improved.

According to the present embodiment, furthermore, the atmosphere separating cover 39 that surrounds the laser irradiation region of each substrate is located in the annealing chamber 37 in which the laser is applied to the substrate, and the gases are supplied to the inside of the cover 39 by means of the gas supply section 40. By doing this, only the necessary atmosphere portion for annealing, near the laser irradiation position in the chamber 37, can be controlled with ease. Accordingly, no impurities can get into the annealing chamber 37 despite the atmosphere at normal pressure or the given positive pressure, and the film state can be stabilized without using any expensive vacuum pump. Thus, the construction of the laser annealing device can be simplified to lower the manufacturing costs, and the gas consumption can be made less than in the case where the annealing chamber is filled up with gases. In consequence, operating costs of the apparatus can be reduced.

The gas supply section 40 is provided with the oxygen concentration sensor 41 for detecting the atmosphere inside the atmosphere separating cover 39 and the gas control sections 40c for controlling the gases supplied to the inside of the cover 39. Therefore, annealing can be effected in a desired atmosphere, so that the quality of the substrates can be improved. For example, the a-Si thin film can be converted into p-Si with a larger crystal grain size, for example. Further, the quality of the substrates can be improved by enhancing the mobility of the transistor characteristics or the like.

Further, the atmosphere separating cover 39 is opposed across the predetermined gap G to the stage 37b that supports each substrate in the annealing chamber 37. Owing to laminar flows of the gases that pass through the gap G, the atmosphere can enjoy a fixed oxygen concentration, so that annealing can be effected in a desired atmosphere. Thus, the quality of the substrates can be improved with use of a simple construction.

The to-be-treated object, for use as a substrate of a liquid crystal display panel, is annealed by means of an excimer laser. Thus, the a-Si film or non-crystalline silicon film that forms the channel, drain, and source regions 84, 85 and 86 can be suitably crystallized into a p-Si film or polycrystalline silicon film.

Besides, substrates of a desired quality can be obtained by loading the annealing chamber 37 with a nitrogen atmosphere. The oxygen concentration of the atmosphere in the chamber 37 is adjustable to 0.1% to 13%, preferably 1.0% to 7.0%. Thus, the a-Si thin film can be converted into p-Si with a larger crystal grain size, and the quality of the substrates can be improved by enhancing the mobility of the transistor characteristics or the like.

It is to be understood that the present invention is not limited to the embodiment described above, and that various changes and modifications may be effected therein by one skilled in the art without departing from the scope or spirit of the invention. According to the above-described embodiment, for example, the film forming device 2 is supposed to include the one load-locking chamber 22, four film forming chambers 25, and one heating chamber 26. Depending on the type of to-be-treated objects, treatment time, etc., however, these chambers may be combined in any suitable numbers to improve the operating efficiency of the apparatus and shorten the treatment time.

Figure 20:
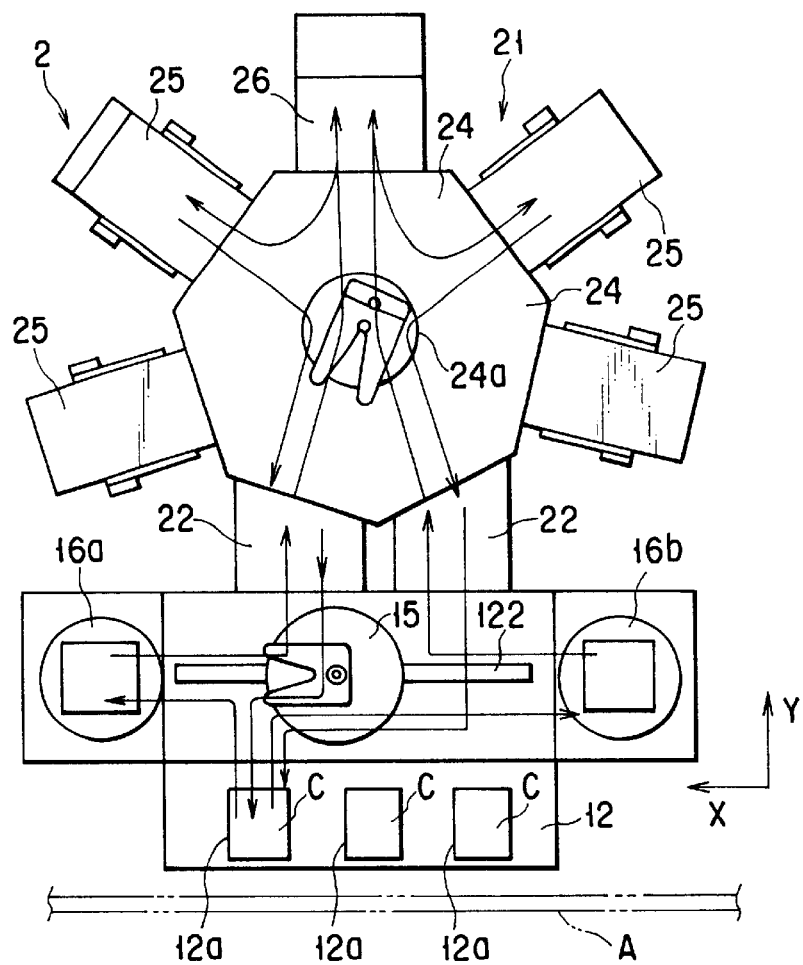
FIG. 20 is a plan view showing a film forming device according to another embodiment of the invention.

According to another embodiment shown in FIG. 20, a film forming device 2 includes a cassette station 12, which have three cassette stage sections 12a arranged along a transportation path A, and two spin-washing units 16a and 16b located individually on the opposite sides of the station 12 in the X-direction. A treatment section 21 is provided with a pair of load-locking chambers 22 that are opposed to the station 12 in the Y-direction. The chambers 22 are arranged in the X-direction. Further, the treatment section 21 includes one heating chamber 26 and four film forming chambers 25. A transfer robot 15 is located between the two spin-washing units 16a and 16b and also between the cassette station 12 and the load-locking chambers 22.

Each spin-washing unit, heating chamber 26, and each film forming chamber 25 are constructed in the same manner as their counterparts according to the foregoing embodiment. The individual parts of the transfer robot 15, which is of a double-hand type having two hands, resemble those of the transfer robot of the first embodiment in construction and operation.

According to the film forming device 2 constructed in this manner, glass substrates stored in cassettes C are transported alternatively to the two spin-washing units 16a and 16b by the transfer robot 15, as indicated by arrows in FIG. 20. After they are washed, the substrates are loaded directly into their corresponding load-locking chambers 22. The substrates are loaded into or unloaded from the washing units 16a and 16b in the X-direction. On the other hand, the glass substrates are loaded into or unloaded from each cassette C and each load-locking chamber 22 in the Y-direction that is perpendicular to the X-direction.

Each glass substrate loaded into one of the load-locking chambers 22 is placed on a rotatable stage (not shown) in the chamber 22, and is turned by the stage so that its center line passes through the center of a vacuum transfer chamber 24. Subsequently, the glass substrate is transferred from the chamber 22 to the heating chamber 26 by a transfer robot 24a in the transfer chamber 24 and heat-treated. Thereafter, the substrate is transferred from the chamber 26 to any of the film forming chambers 25, whereupon a desired thin film is formed on the substrate. After the film formation, the glass substrate is transferred from the film forming chamber 25 to the load-locking chamber 22 by the robot 24a. After the substrate is reoriented in the chamber 22 so that its center line extends parallel to the Y-direction, it is taken out of the chamber 22 and returned to the cassette C by the transfer robot 15.

The same functions and effects of the foregoing embodiment can be also obtained with use of the film forming device 2 constructed in this manner. The use of the two spin-washing units 16a and 16b ensures further improvement of the treatment efficiency.

Moreover, the film forming device 2 includes the four film forming chambers 25 and the heating chamber 26, and a wet etching chamber 6 includes four medical fluid treatment sections 73. Alternatively, however, each treatment device may be formed by freely changing each of the chambers or treatment sections into a film forming chamber, heating chamber, laser annealing chamber, ion doping chamber, or medical fluid treatment section. By doing this, the course of treatment can be shorted to reduce the treatment time, and the operating efficiency of the apparatus can be further improved.

Figure 21:
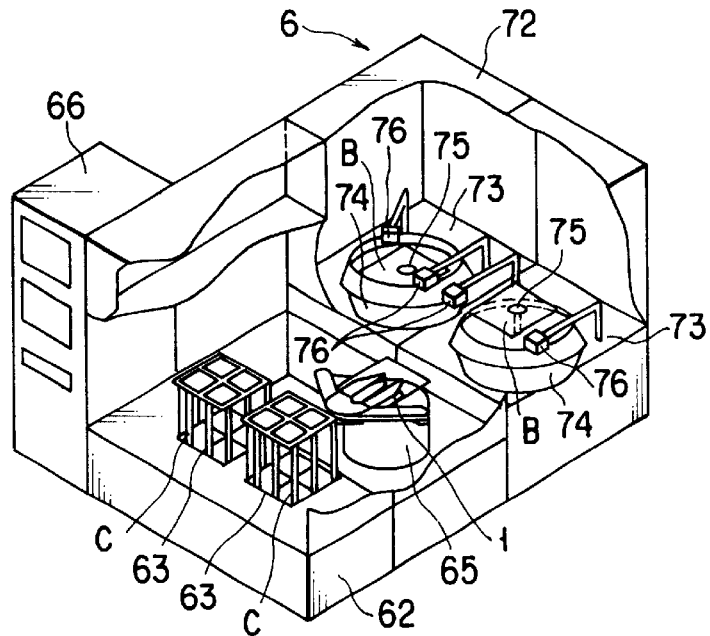
FIG. 21 is a perspective view showing a modification of the wet etching device.

The wet etching device 6 is provided with the four medical fluid treatment sections 73. As shown in FIG. 21, however, the same effect can be obtained with use of a device that is provided with only two medical fluid treatment sections 73 without including any standby stage.

The medical fluid treatment sections 73 of the wet etching device 6 may use one and the same specific medical fluid or different fluids, such as a sensitizing agent, resist solution, developing agent, etching solution, release agent, pure water, ionic water, etc. Alternatively, at least one of functions for various processes, including a medical fluid process, developing process, etching process, resist-coating process, purifying process, and drying process, may be given to each of a plurality of medical fluid treatment sections 73. By doing this, one treatment device can be enabled continuously or alternatively to execute the resist-coating process, developing process, etching process, releasing process, and washing process.

In the laser annealing device according to the foregoing embodiment, the one annealing chamber 37 is opposed to the one cassette station 32. Alternatively, a plurality of annealing chambers 37 may be opposed to the one cassette station 32. By providing a preheating chamber directly opposite to the cassette station 32, moreover, the construction of the device can be simplified so that sources of particles can be reduced to ensure annealing in a stable atmosphere. In consequence, the quality of the substrates can be improved.

Figure 22:
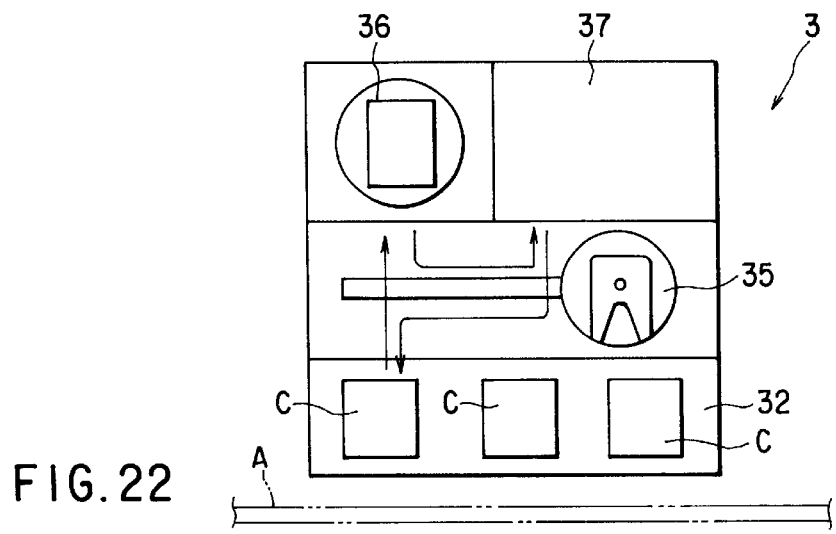
FIG. 22 is a plan view showing a modification of the laser annealing device.

In the laser annealing device 3, furthermore, the spin-washing unit 36 may be located side by side with the annealing chamber 37 in the X-direction that is parallel to the transportation path A, as shown in FIG. 22. The washing unit 36 for washing the substrates may be designed for post-treatments for annealing as well as for the pretreatments.

Although nitrogen gas or the like are used as the atmosphere of the annealing chamber 37 or the atmosphere inside the atmosphere separating cover 39 according to the foregoing embodiment, any other gases, e.g., argon or other inert gases, may be used for the purpose.

In the substrate manufacturing apparatus described therein, a plurality of treatment devices are arranged along the linear transportation path A. However, the way of arranging the transportation path and the treatment sections may be freely changed as required. According to still another embodiment shown in FIG. 23, a substrate manufacturing apparatus comprises a plurality of treatment chambers 150 that are arranged at predetermined intervals. A stocker 152, which can carry a plurality of cassettes thereon, is provided on one end side of each treatment chamber.

A main transportation path B of a main transportation device 154 and a transfer vehicle 154a are arranged on the ceiling of a plant in which the substrate manufacturing apparatus is installed. The truck 154a is movable along the path B. The main transportation path B is in the form of an elongate track, part of which extends over the stockers 152. The truck 154a, which can bear a plurality of cassettes thereon, is designed to move to a position over any one of the stockers 152 and deliver to or receive the cassettes from the stocker.

Further, an auxiliary transportation device 156 is provided between each two adjacent treatment chambers 150. The device 156 includes a transportation path D in the form of an elongate track, extending at right angles to the main transportation path B, and a transfer vehicle 156a that runs self-propelled along the path D. The truck 154a, which can bear a plurality of cassettes thereon, is designed to transfer the cassettes between the stockers 152 and between treatment devices (mentioned later) in the treatment chambers 150 on either side.

Figure 23:
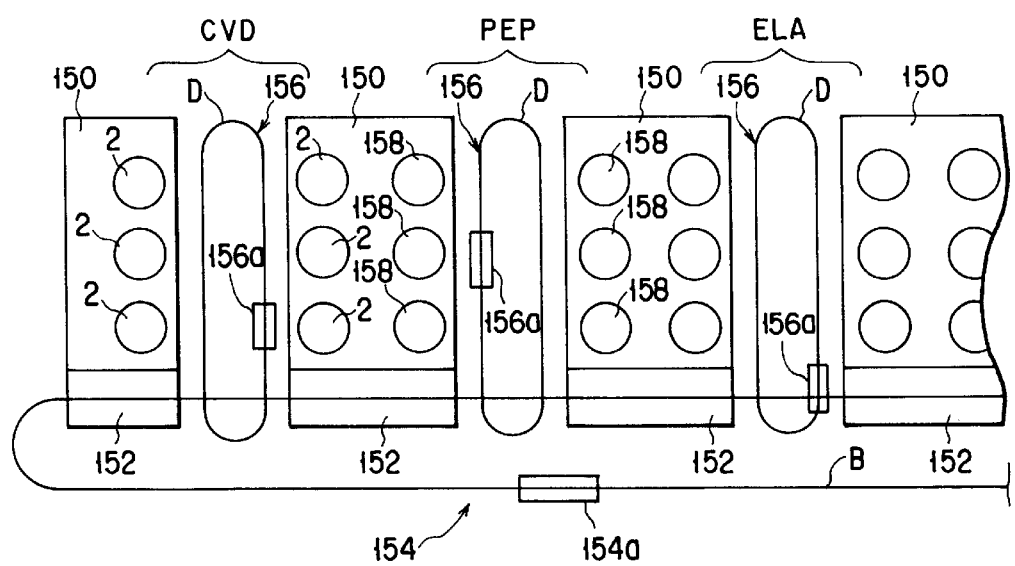
FIG. 23 is a plan view schematically showing a substrate manufacturing apparatus according to still another embodiment of the invention.

A plurality of treatment devices are arranged in each treatment device 150. According to the present embodiment, identical treatment devices for the same treatment are arranged side by side along the respective side edges of each two adjacent treatment chambers 150 on either side of each auxiliary transportation device 156 that face the device 156. Referring to FIG. 23, for example, there are shown a plurality of film forming devices (CVD) 2, which are arranged side by side on either side of the device 156 at the left-hand end, a plurality of photo-etching devices (PEP) 158 on either side of the device 156 in the center, and a plurality of excimer laser annealing device (ELA) 3 on either side of the device 156 at the right-hand end.

Each film forming device 2 and each excimer laser annealing device 3 are constructed in the same manner as their counterparts according to the foregoing embodiments.

The same functions and effects of the foregoing embodiments can be also obtained with use of the manufacturing apparatus constructed in this manner. Further, the cleanness of the interior of each treatment chamber 150 can be improved relatively easily by collectively arranging a plurality of treatment devices in each treatment chamber so that they are isolated from the outside.

Although manufacturing apparatuses for an array substrate of a liquid crystal display panel have been described in connection with the foregoing embodiments, it is to be understood that the present invention is not limited to those embodiments and may be also applied to a manufacturing apparatus for a semiconductor device and the like with the same result.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A treatment device for treating a to-be-treated object, comprising:

a stage section carrying the object thereon;

a treatment section opposed to the stage section, for subjecting the object to a predetermined treatment, the treatment section including a transportation portion opposed to the stage section, for loading and unloading the object, and two or more individual treatment portions located adjacent to the transportation portion, for subjecting the object to a desired treatment or treatments, one of the individual treatment portions including a film forming chamber kept in a vacuum to form a thin film on the object by chemical vapor deposition;

a washing section for washing the object, the washing section being arranged near the stage section and the treatment section and deviated from a space between the stage section and the treatment section in a second direction crossing a first direction passing through the stage section and the treatment section; and a transportation mechanism between the stage section and the treatment section for transferring the object between the stage section, treatment section, and washing section and loading the object, washed in the washing section, directly into the treatment section.

2. A treatment device according to claim 1, wherein the second direction is perpendicular to the first direction.

3. A treatment device for treating a to-be-treated object comprising:

a stage section carrying the object thereon;

a treatment section opposed to the stage section, for subjecting the object to a predetermined treatment, the treatment section including a transportation portion opposed to the stage section, for loading and unloading the object, and one or more individual treatment portions located adjacent to the transportation portion, for subjecting the object to a desired treatment or treatments, one of the individual treatment portions including a film forming chamber kept in a vacuum to form a non-single-crystalline silicon film on the object by chemical vapor deposition;

a washing section for washing the object, the washing section being arranged near the stage section and the treatment section and deviated from a space between the stage section and the treatment section in a second direction crossing a first direction passing through the stage section and the treatment section; and a transportation mechanism between the stage section and the treatment section for transferring the object between the stage section, treatment section, and washing section and loading the object, washed in the washing section, directly into the treatment section.

4. A treatment device for treating a to-be-treated object, comprising:

a stage section carrying the object thereon;

a treatment section opposed to the stage section, for subjecting the object to a predetermined treatment, the treatment section including a transportation portion opposed to the stage section, for loading and unloading the object and one or more individual treatment portions located adjacent to the transportation portion, for subjecting the object to a desired treatment or treatments, one of the individual treatment portions including a laser annealing chamber for subjecting the object to laser annealing and laser generating means for applying a laser beam to the object in the laser annealing chamber;

a washing section for washing the object, the washing section being arranged near the stage section and the treatment section and deviated from a space between the stage section and the treatment section in a second direction crossing a first direction passing through the stage section and the treatment section; and a transportation mechanism between the stage section and the treatment section for transferring the object between the stage section, treatment section, and washing section and loading the object, washed in the washing section, directly into the treatment section.

5. A treatment device for treating a to-be-treated object, comprising:

a stage section carrying the object thereon;

a treatment section opposed to the stage section, for subjecting the object to a predetermined treatment;

a washing section for washing the object, the washing section being arranged near the stage section and the treatment section and deviated from a space between the stage section and the treatment section in a second direction crossing a first direction passing through the stage section and the treatment section; and a transportation mechanism between the stage section and the treatment section for transferring the object between the stage section, treatment section, and washing section and loading the object, washed in the washing section, directly into the treatment section, wherein the transportation mechanism includes a driving section, movable between a reference position opposed to the object placed on the stage section, a first position where the object is loaded into or unloaded from the washing section, and a second position where the object is loaded into or unloaded from the treatment section, and a hand portion located on the driving section for rotation and linear extension and contraction and capable of holding the substrate, wherein the stage section of the treatment device includes a position detecting means for detecting a deviation of the object on the stage section from the reference position in the second direction, and wherein the transportation mechanism includes control means for moving the driving section to a position deviated from the reference position for the positional deviation detected by the position detecting means as the object is unloaded from the stage section.

6. A laser annealing device comprising:

an annealing chamber for storing a to-be-treated object in a manner such that an atmosphere surrounding a laser irradiation region of the object is kept at a pressure not lower than atmospheric pressure;

laser irradiation means for applying a laser beam to the laser irradiation region of the object stored in the annealing chamber, thereby subjecting the object to laser annealing;

transportation means for loading the object directly into the annealing chamber;

a stage section opposed to the annealing chamber and carrying the to-be-treated object thereon; and a washing section located adjacent to the stage section and the annealing chamber, for washing the object, wherein the transportation means includes a transfer robot for transferring the object from the stage section to the washing section and loading the washed object from the washing section directly into the annealing chamber.

7. A laser annealing device comprising:

an annealing chamber storing a to-be-treated object;

an atmosphere separating cover disposed in the annealing chamber and surrounding a laser irradiation region of the object; and gas supply means for supplying a gas to a space inside the atmosphere separating cover.

8. A laser annealing device according to claim 7, wherein the gas supply means includes detecting means for detecting the atmosphere concentration inside the atmosphere separating cover and gas control means for controlling the gas to be supplied to the space inside the atmosphere separating cover.

9. A laser annealing device according to claim 7, further comprising a stage disposed in the annealing chamber and supporting the object, and wherein the atmosphere separating cover has an end portion facing the laser irradiation region of the object on the stage across a predetermined gap.

10. A laser annealing device according to claim 7, wherein the laser generating means includes an excimer laser source and an optical system for guiding a laser beam from the excimer laser source into the annealing chamber to irradiate the object, thereby subjecting a thin film formed on the object to laser annealing.

11. A manufacturing apparatus comprising:

a transportation device for transporting a to-be-treated object along a predetermined transportation path; and a plurality of treatment devices arranged along the transportation path, for individually subjecting the object transported by the transportation device to predetermined treatments, at least one of the treatment devices including a stage section carrying thereon the object transported by the transportation device, a treatment section opposed to the stage section, for subjecting the object to a predetermined treatment, a washing section for washing the object, the washing section being located near the stage section and the treatment section and deviated from a space between the stage section and the treatment section in a second direction crossing a first direction passing through the stage section and the treatment section, and a transportation mechanism arranged between the stage section and the treatment section for transferring the object between the stage section, treatment section, and washing section and loading the object, washed in the washing section, directly into the treatment section, wherein the first direction is perpendicular to the transportation path and the second direction is substantially parallel to the transportation path.

12. A substrate manufacturing apparatus for manufacturing a substrate of a flat display device, comprising:

a transportation device for transporting the substrate along a predetermined transportation path; and a plurality of treatment devices arranged along the transportation path, for individually subjecting the substrate transported by the transportation device to predetermined treatments, at least one of the treatment devices including a stage section carrying thereon the substrate transported by the transportation device, a treatment section opposed to the stage section for subjecting the substrate to a predetermined treatment, a washing section for washing the substrate, the washing section being located near the stage section and the treatment section and deviated from a space between the stage section and the treatment section in a second direction crossing a first direction passing through the stage section and the treatment section, and a transportation mechanism between the stage section and the treatment section for transferring the substrate between the stage section, treatment section, and washing section and loading the substrate, washed in the washing section, directly into the treatment section, wherein the treatment section includes a transportation portion opposed to the stage section, for loading and unloading the substrate, and two or more individual treatment portions located adjacent to the transportation portion, for subjecting the substrate to a desired treatment or treatments, and one of the individual treatment portions includes a film forming chamber depressurized to form a thin film on the substrate by chemical vapor deposition.

13. A substrate manufacturing apparatus according to claim 12, wherein the second direction is perpendicular to the first direction.

14. A substrate manufacturing apparatus for manufacturing a substrate of a flat display device, comprising:
   a transportation device for transporting the substrate along a predetermined transportation path; and
   a plurality of treatment devices arranged along the transportation path for individually subjecting the substrate transported by the transportation device to predetermined treatments,
   at least one of the treatment devices including a stage section carrying thereon the substrate transported by the transportation device, a treatment section opposed to the stage section for subjecting the substrate to a predetermined treatment, a washing section for washing the substrate, the washing section being located near the stage section and the treatment section and deviated from a space between the stage section and the treatment section in a second direction crossing a first direction passing through the stage section and the treatment section, and a transportation mechanism between the stage section and the treatment section for transferring the substrate between the stage section, treatment section, and washing section and loading the substrate, washed in the washing section, directly into the treatment section,
   wherein the treatment section includes a transportation portion opposed to the stage section, for loading and unloading the substrate, and two or more individual treatment portions located adjacent to the transportation portion, for subjecting the substrate to a desired treatment or treatments, and one of the individual treatment portions includes a film forming chamber depressurized to form a non-single-crystalline silicon film on the substrate by chemical vapor deposition.

15. A substrate manufacturing apparatus for manufacturing a substrate of a flat display device, comprising:
   a transportation device for transporting the substrate along a predetermined transportation path; and
   a plurality of treatment devices arranged along the transportation path for individually subjecting the substrate transported by the transportation device to predetermined treatments,
   at least one of the treatment devices including a stage section carrying thereon the substrate transported by the transportation device, a treatment section opposed to the stage section for subjecting the substrate to a predetermined treatment, a washing section for washing the substrate, the washing section being located near the stage section and the treatment section and deviated from a space between the stage section and the treatment section in a second direction crossing a first direction passing through the stage section and the treatment section, and a transportation mechanism between the stage section and the treatment section for transferring the substrate between the stage section, treatment section, and washing section and loading the substrate, washed in the washing section, directly into the treatment section,
   wherein the treatment section includes a transportation portion opposed to the stage section, for loading and unloading the substrate, and two or more individual treatment portions located adjacent to the transportation portion, for subjecting the substrate to a desired treatment or treatments, and one of the individual treatment portions includes an annealing chamber for storing the substrate in a manner such that an atmosphere surrounding a laser irradiation region of the substrate is kept at a pressure not lower than atmospheric pressure, and laser generating means for applying a laser beam to the substrate in the annealing chamber.

16. A substrate manufacturing apparatus for manufacturing a substrate of a flat display device, comprising:
   a transportation device for transporting the substrate along a predetermined transportation path; and
   a plurality of treatment devices arranged along the transportation path, for individually subjecting the substrate transported by the transportation device to predetermined treatments,
   wherein at least one of the treatment devices includes a stage section carrying thereon the substrate transported by the transportation device, a treatment section opposed to the stage section for subjecting the substrate to a predetermined treatment, a washing section for washing the substrate, the washing section being located near the stage section and the treatment section and deviated from a space between the stage section and the treatment section in a second direction perpendicularly crossing a first direction passing through the stage section and the treatment section, and a transportation mechanism between the stage section and the treatment section for transferring the substrate between the stage section, treatment section, and washing section and loading the substrate, washed in the washing section, directly into the treatment section, and
   wherein the transportation device includes a cassette storing substrates stacked in layers at predetermined intervals and a transfer vehicle movable with the cassette thereon along the transportation path and used to deliver to and receive the cassette from the stage section of the treatment device, and the transportation mechanism includes a transfer robot for transporting each substrate in the first direction to the cassette placed on the stage section and the treatment section and transporting the substrate in the second direction to the washing section.

17. A substrate manufacturing apparatus according to claim 16, wherein the transfer robot includes a driving section, movable between a reference position opposed to the cassette placed on the stage section, a first position where the substrate is loaded into or unloaded from the washing section, and a second position where the substrate is loaded into or unloaded from the treatment section, and a hand portion located on the driving section for rotation and linear extension and contraction and for holding the substrate, the stage section of the treatment device includes a position detecting means for detecting a deviation of the substrate in the cassette from the reference position in the second direction, and the transportation mechanism includes control means for moving the driving section to a position deviated from the reference position for the positional deviation detected by the position detecting means as the substrate is unloaded from the cassette on the stage section.

* * * * *